US006879605B2

(12) United States Patent
Kyusho et al.

(10) Patent No.: US 6,879,605 B2
(45) Date of Patent: Apr. 12, 2005

(54) METHOD AND APPARATUS FOR PERFORMING PATTERN DEFECT REPAIR USING Q-SWITCHED MODE-LOCKED PULSE LASER

(75) Inventors: Yukio Kyusho, Tokyo (JP); Yoichi Yoshino, Tokyo (JP); Yukio Morishige, Tokyo (JP)

(73) Assignee: Laserfront Technologies, Inc., Kanagawa (JP)

( * ) Notice: Subject to any disclaimer, the term of this patent is extended or adjusted under 35 U.S.C. 154(b) by 215 days.

(21) Appl. No.: 09/915,059

(22) Filed: Jul. 24, 2001

(65) Prior Publication Data

US 2002/0009843 A1 Jan. 24, 2002

(30) Foreign Application Priority Data

Jul. 24, 2000 (JP) ........................................ 2000-222556

(51) Int. Cl.[7] .............................................. H01S 3/10
(52) U.S. Cl. .............................. 372/25; 372/10; 372/18
(58) Field of Search ............................ 372/10, 18, 22, 372/25, 26; 356/237.1, 237.4, 237.5

(56) References Cited

U.S. PATENT DOCUMENTS

| | | | | |
|---|---|---|---|---|
| 5,539,764 A | * | 7/1996 | Shields et al. ................. | 372/57 |
| 5,546,415 A | * | 8/1996 | Delfyett et al. ................ | 372/25 |
| 5,710,787 A | * | 1/1998 | Amada et al. ................. | 372/25 |
| 5,742,634 A | * | 4/1998 | Rieger et al. .................. | 372/25 |
| 5,790,574 A | * | 8/1998 | Rieger et al. .................. | 372/25 |
| 5,847,863 A | * | 12/1998 | Galvanauskas et al. ........ | 359/41 |
| 5,852,621 A | * | 12/1998 | Sandstrom .................... | 372/25 |
| 5,862,287 A | * | 1/1999 | Stock et al. ................. | 385/123 |
| 5,987,042 A | * | 11/1999 | Staver et al. ................. | 372/30 |
| 6,281,471 B1 | * | 8/2001 | Smart ..................... | 219/121.62 |
| 6,339,604 B1 | * | 1/2002 | Smart ........................... | 372/26 |
| 6,373,864 B1 | * | 4/2002 | Georges et al. ............... | 372/10 |
| 6,404,787 B1 | * | 6/2002 | Unternahrer et al. ......... | 372/25 |
| 6,549,267 B1 | * | 4/2003 | Kudo ........................... | 355/53 |
| 6,574,250 B2 | * | 6/2003 | Sun et al. ..................... | 372/25 |

FOREIGN PATENT DOCUMENTS

| | | |
|---|---|---|
| JP | 57-1279 | 1/1982 |
| JP | 61-56479 | 3/1986 |
| JP | 64-81376 | 3/1989 |
| JP | 2-32323 | 2/1990 |
| JP | 2-146786 | 6/1990 |
| JP | 4-318990 | 11/1992 |
| JP | 5-102565 | 4/1993 |
| JP | 5-102567 | 4/1993 |
| JP | 5-249657 | 9/1993 |
| JP | 8-160600 | 6/1996 |
| JP | 11-221684 | 8/1999 |

OTHER PUBLICATIONS

Y. Kyusho, et al., "High–Energy Subnanosecond Compact Laser System With Diode–Pumped, Q–Switched Nd:YVO$_4$ Laser", *OSA TOPS on Advanced Solid–State Lasers*, 1996, vol. 1, pp. 382–3385.

Japanese Office Action dated Jul. 23, 2002 with partial English Translation.

* cited by examiner

*Primary Examiner*—David Porta
*Assistant Examiner*—Davienne Monbleau
(74) *Attorney, Agent, or Firm*—Dickstein, Shapiro, Morin & Oshinsky, LLP.

(57) ABSTRACT

A method for repairing a pattern by using a laser and a laser-based pattern repair apparatus are provided which are capable of reducing splashes, rolling-up, and damage to a glass substrate to a minimum in pattern defects repairing processing by removing a thin metal layer such as a chromium layer. A part of a string of pulses obtained by slicing, using an optical shutter, pulses from laser light having a pulse width of 10 ps to 300 ps emitted from a Q-switched mode-locked pulse laser is used to produce multi-pulses which are divided into two portions in terms of time base correction using an optical delaying unit.

74 Claims, 10 Drawing Sheets

METHOD AND APPARATUS FOR PERFORMING PATTERN DEFECT REPAIR USING Q-SWITCHED MODE-LOCKED PULSE LASER

BACKGROUND OF THE INVENTION

1. Field of the Invention

The present invention relates to a method for repairing a pattern using laser, including photomask repairing processing and fine pattern defect repairing processing, and a laser-based pattern repair apparatus.

The present application claims priority of Japanese Patent Application No. 2000-222556 filed on Jul. 24, 2000, which is hereby incorporated by reference.

2. Description of the Related Art

A laser processing apparatus employing laser oscillation light, precision movable stage, and scanning technology in combination is used widely in various areas. In particular, An apparatus for repairing an ultra-fine pattern defect by using pulsed laser light, is recently used not only in semiconductor technology, as a laser mask repair apparatus or a like but also in medical field. In processes of photolithography being a main process of LSI (Large Scale Integrated circuit) manufacturing, a plurality of photomasks is used. The laser mask repair apparatus is an apparatus adapted to repair a variety of defects on the photomask using a laser. As shown in a cross-sectional view in FIG. 9A, the photomask is so configured that a pattern made up of a highly light-tight metal chromium thin layer is formed on a main face of silica-based glass having high optical transmittance of light with a short wavelength. A variety of types of defects on the pattern are shown in FIG. 9B. The pattern defects can be broadly classified into two types, one being a residual defect generally called an opaque defect and the other being a chip generally called a clear defect. The opaque defect is repaired by laser-based removing processing or a like and the clear defect is repaired by laser CVD (Chemical Vapor Deposition) processing. The laser-based removing processing is a most general photomask defect repair processing performed by using the laser. Most of laser repair apparatuses are based on the above laser-based removing processing technologies. The laser used in the laser repair apparatus is a solid-state laser employing Nd:YAG (Neodymium:YttriumAluminumGarnet), Nd:YLF (Neodymium:Yttrium Lithium Fluoride), Nd:YVO$_4$ (Neodymium:Vanadium tetroxide Yttrium) or a like as a laser medium. The reason that such solid-state lasers are used is firstly because Q-switched pulse oscillation enabling high peak power (short pulse width) to be provided can be achieved in a stable manner, secondly because it can produce harmonics, and thirdly because it can be small-sized and is excellent in controllability and/or maintainability.

Processing in which laser light is condensed on a microspot to cause a chromium thin layer to be evaporated and removed is called a zapping process. In the zapping processing, Q-switched pulsed laser light having a pulse width of about 5 nanoseconds to 10 nanoseconds is conventionally used.

To enhance controllability in the zapping processing, when the pulse width of the laser is shortened, a method is used in which a length of an optical resonator is made smaller, intensity of light for pumping to be applied to the laser medium is made higher to produce the Q-switched laser pulse that can provide a high-speed rise. For example, conventionally, by a MOPA (Master Oscillator Power Amplifier) method in which an LD (Laser Diode) pumping type Nd:YVO$_4$ microchip laser is used as a main oscillator (master oscillator) in the optical resonator having a resonator length of about 25 mm and laser light emitted from the oscillator is amplified by an optical amplifier, sub-nanosecond pulsed laser light with a pulse width of 0.85 ns (nanoseconds) that provides energy of 10 mJ/pulse is produced and is used as a pumping source (Y. Kyusho et al.; OSA TOPS on Advanced Solid-State Lasers, Vol. 1 (1996)).

However, the conventional laser photomask repair technology has a problem in that phenomena as shown in FIG. 10 occur at a time of the zapping processing. That is, swelling caused by heat affected zones, limpness of an edge, splashes, and a decrease in mask transmittance caused by damage to a glass substrate occur when the zapping is performed on the Cr (chromium) layer.

A first problem is that, when pulsed laser light having a pulse width of 5 ns to 10 ns is used, the heat affected zone having a length of about 0.5 μm to 1.0 μm is produced. A length of thermal diffusion of Cr used in the photomask is 0.7 μm when the laser pulse width is 5 ns and about 1.4 μm when the pulse width is 10 ns and heat reaches within the length of thermal diffusion. In the laser pulse having such the long width as above, in principle, the heat affected zone occurs more or less. In some cases, the heat affected zone causes the limpness of the edge that decreases fabrication accuracy and a part of the heat affected zone flies about in a form of as plash and deposits on the pattern, thus causing the pattern defect. To avoid this, a method has been conventionally employed to prevent the heat affected zone being fused by properly selecting laser power. Even when sub-nano second pulsed laser light having a pulse width of 0.85 ns, the heat affected zone of 0.12 μm in length is mathematically produced. In order to reduce the length of the heat affected zone to not more than 0.01 μm, pulsed laser light having a pulse width of about 70 ps (picoseconds) is required mathematically. However, it is impossible for a conventional Q-switched laser to produce the pulsed laser light having a pulse width being within this range of 70 ps.

A second problem is that, when the peak power of the laser pulse continues to be increased, an edge portion of a laser irradiation section swells vertically. That is, if the pulse width becomes shorter while the pulse energy in one shot pulse is at a same level, the peak power increases, however, if only the peak power is increased while an area affected by heat is decreased, photon pressure acts, when the laser is applied, as counteractive force in a direction opposite to a light incident direction and, as a result, a very large burr-shaped swelling occurs in a fused layer between the laser irradiation section and laser non-irradiation section. When the pulse width is several 10 ps, in some cases, the burr with a length of not less than 1 μm is produced vertically. This type of burr causes rolling-up and/or damage to the pattern, which should be avoided. In some cases, the fused parts splash, depending on the laser power density, not only in the vertical direction but also in the horizontal direction relative to the photo mask. When the conventional pulsed laser light having a pulse width of the order of nanoseconds is used, the splash having a length of 0.5 μm to 1 μm is produced in many cases. This causes new pattern defects to occur around the laser irradiation section.

A third problem is that the occurrence of the splash is influenced by a relation between a size of an area to which the laser is applied and an irradiated laser power density. That is, a shape of the defect or the state of occurrence of the splash is changed depending on a ratio of a longer side to a shorter side of a rectangular, thus producing an unstable state on the pattern.

A fourth problem is that the employed laser light causes damage to the glass substrate. If power of the laser light is increased or a wavelength of the laser light to be applied is changed to be that of ultraviolet light, damage to the glass substrate occurs to one degree or another. This damage to the glass substrate presents a serious problem in terms of quality of the photomask because the damage causes the transmittance to decrease at a time of exposure processing or an interference pattern to occur.

SUMMARY OF THE INVENTION

In view of the above, it is an object of the present invention to provide a laser-based pattern repair apparatus that enables fine repair processing with high accuracy in repairing an opaque defect or a like of a pattern on a photomask having a minimum line width of not more than 0.18 $\mu$m, by which less heat affected zone, less swelling, fewer splashes, and less damage to a glass substrate can be achieved in laser photomask repair processing.

According to a first aspect of the present invention, there is provided a method for repairing a pattern using a laser including:

a step of using laser light emitted from a Q-switched mode-locked pulse laser as laser light to be applied for repair processing.

According to a second aspect of the present invention, there is provided a method for repairing a pattern using a laser including:

a step of slicing a single laser pulse or multi-laser pulses from a string of pulses making up laser light emitted from a Q-switched mode-locked pulse laser by using an optical modulator and using laser light having the sliced single laser pulse or the sliced multi-laser pulses as laser light to be applied for repair processing.

According to a third aspect of the present invention, there is provided a method for repairing a pattern using a laser including:

a step of slicing a single laser pulse or multi-laser pulses from a string of pulses making up laser light emitted from a Q-switched mode-locked pulse laser by using an optical modulator; and a step of directly amplifying the laser light having the sliced single laser pulse or the sliced multi-laser pulses by using an optical amplifier and using the amplified laser light as laser light to be applied for repair processing.

According to a fourth aspect of the present invention, there is provided a method for repairing a pattern using a laser including:

a step of slicing a single laser pulse or multi-laser pulses from a string of pulses making up laser light emitted from a Q-switched mode-locked pulse laser using an optical modulator; and a step of multiplexing one laser light having a first laser pulse obtained by splitting the single laser pulse or the multi-laser pulses and an other laser light having a second laser pulse obtained by splitting the single laser pulse or the multi-laser pulses and by providing time delay to the second laser pulse into one laser light and using the multiplexed laser light as laser light to be applied for repair processing.

According to a fifth aspect of the present invention, there is provided a method for repairing a pattern using a laser including:

a step of slicing a single laser pulse or multi-laser pulses from a string of pulses making up laser light emitted from a Q-switched mode-locked pulse laser using an optical modulator;

a step of multiplexing one laser light having a first laser pulse obtained by splitting the single laser pulse or the multi-laser pulses and an other laser light having a second laser pulse obtained by splitting the single laser pulse or the multi-laser pulses and by providing time delay to the second laser pulse into one laser light; and a step of directly amplifying the multiplexed laser light by using an optical amplifier and using the amplified laser light as laser light to be applied for repair processing.

According to a sixth aspect of the present invention, there is provided a method for repairing a pattern using a laser including:

a step of slicing a single laser pulse or multi-laser pulses from a string of pulses making up laser light emitted from a Q-switched mode-locked pulse laser using an optical modulator; and a step of converting a wavelength of laser light having the sliced single pulse or the sliced multi-laser pulses to produce harmonic light and using the harmonic light as laser light to be applied for repair processing.

According tea seventh aspect of the present invention, there is provided a method for repairing a pattern using a laser including:

a step of slicing a single laser pulse or multi-laser pulses from a string of pulses making up laser light emitted from a Q-switched mode-locked pulse laser using an optical modulator;

a step of multiplexing one laser light having a first laser pulse obtained by splitting the single laser pulse or the multi-laser pulses and an other laser light having a second laser pulse obtained by splitting the single laser pulse or the multi-laser pulses and by providing time delay to the second laser pulse into one laser light; and a step of converting a wavelength of the multiplexed laser light to produce harmonic light and using the harmonic light as laser light to be applied for repair processing.

According to an eighth aspect of the present invention, there is provided a method for repairing a pattern using a laser including:

a step of slicing a single laser pulse or multi-laser pulses from a string of pulses making up laser light emitted from a Q-switched mode-locked pulse laser using an optical modulator;

a step of directly amplifying laser light having the sliced single laser pulse or the multi-laser pulses using an optical amplifier; and a step of converting a wavelength of the amplified laser light to produce harmonic light and using the harmonic light as laser light to be applied for repair processing.

According to a ninth aspect of the present invention, there is provided a method for repairing a pattern using a laser including:

a step of slicing a single laser pulse or multi-laser pulses from a string of pulses making up laser light emitted from a Q-switched mode-locked pulse laser using an optical modulator;

a step of multiplexing one laser light having a first laser pulse obtained by splitting the single laser pulse or the multi-laser pulses and an other laser light having a second laser pulse obtained by splitting the single laser pulse or the multi-laser pulses and by providing time delay to the second laser pulse into one laser light;

a step of directly amplifying the multiplexed laser light by using an optical amplifier; and a step of converting a wavelength of the amplified laser light to produce harmonic light and using the harmonic light as laser light to be applied for repair processing.

According to a tenth aspect of the present invention, there is provided a method for repairing a pattern using a laser including:

a step of slicing a single laser pulse or multi-laser pulses from a string of pulses making up laser light emitted from a Q-switched mode-locked pulse laser using an optical modulator;

a step of directly amplifying laser light having the sliced single laser pulse or the multi-laser pulse by using an optical amplifier;

a step of multiplexing one amplified laser light having a first laser pulse obtained by splitting the single laser pulse or the multi-laser pulses and another amplified laser light having a second laser pulse obtained by splitting the single laser pulse or the multi-laser pulses and by providing time delay to the second laser pulse into one laser light;

a step of directly amplifying the multiplexed laser light by using an optical amplifier; and a step of converting a wavelength of the amplified laser light to produce harmonic light and using the harmonic light as laser light to be applied for repair processing.

In the foregoing, a preferable mode is one wherein a pulse width of the laser light to be applied for repair processing is in a range of 10 picoseconds to 300 picoseconds.

Also, a preferable mode is one wherein the time delay between the first laser pulse and the second laser pulse is in a range of 0.1 nanoseconds to 10 nanoseconds.

Also, a preferable mode is one wherein the number of the multi-laser pulses to be sliced from the laser light emitted from the Q-switched mode-locked pulse laser and time to start slicing the multi-laser pulses to obtain a first pulse is able to be set in an arbitrary manner.

According to an eleventh aspect of the present invention, there is provided a laser-based pattern repair apparatus including:

a Q-switched mode-locked pulse laser to emit laser light to be applied for repair processing.

According to a twelfth aspect of the present invention, there is provided a laser-based pattern repair apparatus including:

a Q-switched mode-locked pulse laser;

an optical modulator to slice a single laser pulse or multi-laser pulses from a string of pulses contained in laser light emitted from the Q-switched mode-locked pulse laser; and wherein laser light emitted from the optical modulator is used as laser light to be applied for repair processing.

According to a thirteenth aspect of the present invention, there is provided a laser-based pattern repair apparatus including:

a Q-switched mode-locked pulse laser;

an optical modulator to slice a single laser pulse or multi-laser pulses from a string of pulses contained in laser light emitted from the Q-switched mode-locked pulse laser;

an optical amplifier to directly amplify laser light having the sliced single laser pulse or the sliced multi-laser pulses emitted from the optical modulator; and wherein laser light emitted from the optical amplifier is used as laser light to be applied for repair processing.

According to a fourteenth aspect of the present invention, there is provided a laser-based pattern repair apparatus including:

a Q-switched mode-locked pulse laser;

an optical modulator to slice a single laser pulse or multi-laser pulses from a string of pulses contained in laser light emitted from the Q-switched mode-locked pulse laser;

a laser pulse multiplexing and delaying unit to multiplex one amplified laser light having a first laser pulse obtained by splitting the single laser pulse or the multi-laser pulses and another amplified laser light having a second laser pulse obtained by splitting the single laser pulse or the multi-laser pulses and by providing time delay to the second laser pulse into one laser light; and wherein laser light emitted from the laser pulse multiplexing and delaying unit is used as laser light to be applied for repair processing.

According to a fifteenth aspect of the present invention, there is provided a laser-based pattern repair apparatus including:

a Q-switched mode-locked pulse laser;

an optical modulator to slice a single laser pulse or multi-laser pulses from a string of pulses contained in laser light emitted from the Q-switched mode-locked pulse laser;

a laser pulse multiplexing and delaying unit to multiplex one amplified laser light having a first laser pulse obtained by splitting the single laser pulse or the multi-laser pulses and an other amplified laser light having a second laser pulse obtained by splitting the single laser pulse or the multi-laser pulses and by providing time delay to the second laser pulse into one laser light;

an optical amplifier to directly amplify the multiplexed laser light; and wherein laser light emitted from the optical amplifier is used as laser light to be applied for repair processing.

According to a sixteenth aspect of the present invention, there is provided a laser-based pattern repair apparatus including:

a Q-switched mode-locked pulse laser;

an optical modulator to slice a single laser pulse or multi-laser pulses from a string of pulses contained in laser light emitted from the Q-switched mode-locked pulse laser;

a wavelength converting unit to convert a wavelength of laser light having the sliced single pulse or the sliced multi-laser pulses to produce harmonic light; and wherein laser light emitted from the wavelength converting unit is used as laser light to be applied for repair processing.

According to a seventeenth aspect of the present invention, there is provided a laser-based pattern repair apparatus including:

a Q-switched mode-locked pulse laser;

an optical modulator to slice a single laser pulse or multi-laser pulses from a string of pulses contained in laser light emitted from the Q-switched mode-locked pulse laser;

a laser pulse multiplexing and delaying unit to multiplex one laser light having a first laser pulse obtained by splitting the single laser pulse or the multi-laser pulses and an other laser light having a second laser pulse obtained by splitting the single laser pulse or the multi-laser pulses and by providing time delay to the second laser pulse into one laser light;

a wavelength converting unit to convert a wavelength of the multiplexed laser light to produce harmonic light; and wherein laser light emitted from the wavelength converting unit is used as laser light to be applied for repair processing.

According to an eighteenth aspect of the present invention, there is provided a laser-based pattern repair apparatus including:

a Q-switched mode-locked pulse laser;

an optical modulator to slice a single laser pulse or multi-laser pulses from a string of pulses contained in laser light emitted from the Q-switched mode-locked pulse laser;

an optical amplifier to directly amplify the laser light having the sliced single laser pulse or the sliced multi-laser pulses;

a wavelength converting unit to convert a wavelength of laser light emitted from the optical amplifier to produce harmonic light; and wherein laser light emitted from the wavelength converting unit is used as laser light to be applied for repair processing.

According to a nineteenth aspect of the present invention, there is provided a laser-based pattern repair apparatus including:

a Q-switched mode-locked pulse laser;

an optical modulator to slice a single laser pulse or multi-laser pulses from a string of pulses contained in laser light emitted from the Q-switched mode-locked pulse laser;

a laser pulse multiplexing and delaying unit to multiplex one laser light having a first laser pulse obtained by splitting the sliced single laser pulse or the sliced multi-laser pulses and an other laser light having a second laser pulse obtained by splitting the sliced single laser pulse or the sliced multi-laser pulses and by providing time delay to the second laser pulse into one laser light;

an optical amplifier to directly amplify the multiplexed laser light;

a wavelength converting unit to convert a wavelength of laser light emitted from the optical amplifier to produce harmonic light; and wherein laser light emitted from the wavelength converting unit is used as laser light to be applied for repair processing.

According to a twentieth aspect of the present invention, there is provided a laser-based pattern repair apparatus including:

a Q-switched mode-locked pulse laser;

an optical modulator to slice a single laser pulse or multi-laser pulses from a string of pulses contained in laser light emitted from the Q-switched mode-locked pulse laser;

a laser pulse multiplexing, delaying, and amplifying unit to multiplex one laser light having a first laser pulse obtained by splitting the sliced single laser pulse or the sliced multi-laser pulses and an other amplified laser light having a second laser pulse obtained by splitting the sliced single laser pulse or the sliced multi-laser pulses and by providing time delay to the second laser pulse into one laser light and, at the same time, to directly amplify laser light having the first laser pulse by a double pass method in which the laser light is transmitted twice through an optical amplifying medium in a reciprocating manner and to directly amplify laser light having the second laser pulse by a single pass method in which the laser light is transmitted once through the optical amplifying medium;

a wavelength converting unit to convert a wavelength of laser light emitted from the laser pulse multiplexing, delaying, and amplifying unit to produce harmonic light; and wherein laser light emitted from the wavelength converting unit is used as laser light to be applied for repair processing.

In the foregoing, a preferable mode is one wherein the Q-switched mode-locked pulse laser is made up of a laser resonator having a semiconductor laser pumping unit or a lamp pumping unit, a laser medium including any one of a Nd:YLF laser, Nd:YAG laser and Nd:glass laser, an ultrasonic Q-switching element to produce Q-switched pulses, an ultrasonic mode-locker to produce mode-locked pulses, and etalon plates used to select a longitudinal mode of the laser resonator.

Also, a preferable mode is one wherein the laser resonator is provided therein with a plurality of etalon plates each having a different thickness and a remote controller for operating the etalon plates, whereby the etalon plates each having the different thickness are changeably inserted into the laser resonator and disposed on a optical axis thereof.

Also, a preferable mode is one wherein a variable range of a pulse width of laser light that is able to be obtained by the switching for inserting the etalon plates is 10 picoseconds to 300 picoseconds.

Also, a preferable mode is one wherein, when the multi-laser pulses are sliced by the optical modulator from laser light emitted from the Q-switched mode-locked pulse laser, the number of the multi-laser pulses to be sliced and time to start slicing the first pulse are able to be arbitrarily set and to be operated by remote control.

Also, a preferable mode is one wherein the laser pulse multiplexing and delaying unit and the laser pulse multiplexing, delaying, and amplifying unit are able to change the delay time within a range of 0.1 nanoseconds to 10 nanoseconds and the change of the delay time is able to be implemented by remote control.

Also, a preferable mode is one wherein an intensity of a peak power of the first laser pulse and the second laser pulse to be multiplexed and delayed by the laser pulse multiplexing and delaying unit; or multiplexed, delayed, and amplified by the laser pulse multiplexing, delaying, and amplifying unit is able to be controlled and calibrated by remote control.

Furthermore, a preferable mode is one wherein the wavelength converting unit is a wavelength converting element using a nonlinear optical crystal to emit a third harmonic, fourth harmonic, and fifth harmonic each having a wavelength of not more than 360 nm.

With the above configurations, unlike a conventional laser repair processing in which a laser light having a pulse width of the order of a sub-nanosecond, by using the mode-locked pulses each having a pulse width of the order of 10 ps, the repair processing can be carried out so finely and satisfactorily that existence of a heat affected zone is negligible. Therefore, as a first effect of the present invention, since processing is performed in a manner that the heat affected zone is reduced to a minimum, fabrication accuracy can be greatly improved. This is because, by using a string of mode-locked pulses each having a pulse width of the order of 10 ps, length of thermal diffusion being a distance in which heat travels within a laser irradiated time, that is, within a time of a pulse width, can be reduced to about 10 nm in various metals. As a result, occurrence of the heat affected zone that was produced during laser irradiated time can be prevented. Additionally, a shape of a corner section is remarkably improved and R (radius) at a corner can be made small which improves linearity at the time of repair processing. Moreover, occurrence of a splash can be prevented by making the pulse width be of the order of 10 ps which enables peak power to be very large and can make small diameters of grains produced when Cr sublimes, unlike the conventional case in which the laser light having the pulse width of the order of nanosecond is used which causes large splashes to occur. When the laser having the pulse width of the order of 10 ps is used, all that needs is to give some consideration to a problem of sublimation process required when high peak power is applied to metal layers on a mask and to a problem of splashes occurring by a very large photon pressure. Moreover, experiments by the inventors show that, when zapping is performed on a binary mask with a Cr layer having a thickness of about 100 nm attached using the laser having the pulse width of the order of 10 ps, in some cases, burrs occur at an edge portion to be processed or damage to a glass substrate occurs. However, as described above, since the heat affected zone is small, the R (radius) at the corner to be processed is surely made smaller, thus improving the fabrication accuracy. Even when mask materials having a small thickness and low absorption characteristics such as a half-tone mask which seems to be going mainstream in the near feature are processed using the laser light having such an ultra-short pulse width of the order of 10 ps, if power is properly selected, such problems associated with the binary mask can be reduced. In such cases, more finer repair processing can be implemented by using such the laser having the ultra short pulse width of the order of 10 ps.

On the other hand, in a case where a problem associated with the ultra-short pulse cannot be solved in some materials for the mask, the problem can be solved by expanding the pulse width up to 300 ps. When the pulse width of the laser is expanded from 10 ps to 300 ps, a length of damage to the glass substrate is reduced to about 10 nm and a height of the burrs occurring at an edge to be processed is reduced to about 10 nm and, as a result, fabrication accuracy of about 10 nm can be achieved. Thus, by changing the pulse width from 10 ps to 300 ps, a range of optimization in repair processing can be greatly expanded.

With another configuration, a way of mode-locking can be changed by controlling the number of longitudinal modes using an etalon plate. This enables width of the mode-locked pulse to be changed depending on the number of the etalon plates. Therefore, to solve the above problems of the splash, optimum processing conditions can be selected. Especially, to obtain the optimum processing conditions by using only one pulse, there is no other way but to optimize the mode-locked pulse width and peak power value. Therefore, a point that the mode-locked pulse width is variable is very important. Great effects can be obtained by optimizing the pulse width. If the pulse width can be changed by one integral oscillator, costs can be greatly reduced when compared with a case in which an oscillator to produce the laser having pulse width of the order of 10 ps and an oscillator to produce the laser having pulse width of the order of 100ps are manufactured separately.

With still another configuration, multi-pulses can be freely produced. When stable processing with high accuracy only by controlling the pulse width and the peak power can not be achieved, some thought has to be put into the state of being heated up at an area to which the laser is applied so that the processing method can meet conditions given by characteristics of the materials to be processed. In this case, two shots or more of the laser pulse for processing are required. According to the present invention, by changing not only the pulse width and peak power value but also cycles of irradiation of the laser, optimum processing conditions can be obtained. That is, by selecting optimum processing parameters that can meet the conditions of the object to be processed, the zapping to minimize the heat affected zone is made possible. Experiments show that, when the processing is performed by using the multi-pulses including two pulses or more, time intervals among pulses affect processing results. Therefore, by using the Q-switched mode-locked pulse oscillator shown in the present invention, it is made possible to use picosecond to nanosecond pulses being stable for a long time. For example, by selecting etalon, the laser light having the long mode-locked pulse width of the order of 500 ps can be acquired. By overlapping this long pulse width using the multi-pulse producing method of the present invention, it is possible to produce the pulse width of 10 ns in a pseudo manner. As a result, optimum processing conditions can be provided to various kinds of materials to be processed. When the processing is carried out by using two pulses or more, it is possible to change a ratio of intensity between the first pulse and the second pulse or to make the string of pulses larger or smaller gradually. There are some cases in which, if some materials are heated up to their boiling point at one shot, the processing has to be carried out in an explosive atmosphere and therefore it becomes difficult to perform a highly controlled processing with high accuracy. In such the cases, by heating the material intermittently and gradually, the explosiveness is minimized and the occurrence of the splash can be reduced. In the ordinary Cr mask, a CrO layer is stacked on the surface of the mask as an AR (Anti-Reflection) layer. This layer absorbs much of the laser with wavelengths making up a second harmonic and third harmonic and, when the pulse having large energy is applied at one shot, the processing is carried out in the explosive atmosphere, resulting in the occurrence of many splashes. This problem can be solved by making the first pulse smaller to remove only the CrO layer and by making the second pulse larger to remove Cr layer. In contrast, in a case of material shaving small absorption coefficient or having very high thermal conductivity, a method in which the first pulse is made larger and then is made smaller gradually is effective. It is possible to produce a string of pulses that can satisfy conditions for both the materials and the best suitable processing conditions can be prepared for a wider variety of materials.

With still another configuration, processing for repairing micro-defects on a reticle mask of 0.5 $\mu$L/S can be effectively performed by using ultraviolet light laser with a wavelength of not more than 360 nm. Resolving power for processing is given by k$\lambda$/NA, where "k" denotes a proportional constant, "NA" denotes numerical apertures of an objective lens. Actually, since the "NA" of the objective lens to be used comes near to the "k", the "$\lambda$" is critical resolving power for processing. To perform the processing a pattern defect with a length of not more than 0.5 $\mu$m, the use of laser having a short wavelength being not more than 360 nm obtained by a third harmonic generation method based on fundamental waves of the Nd:YLF laser or Nd:YAG laser is essential and, therefore, fine repair processing can be implemented by using laser light the wavelength of which is made shorter by fourth harmonic generation (FHG) and fifth harmonic generation (FIHG) methods.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Figure 1:
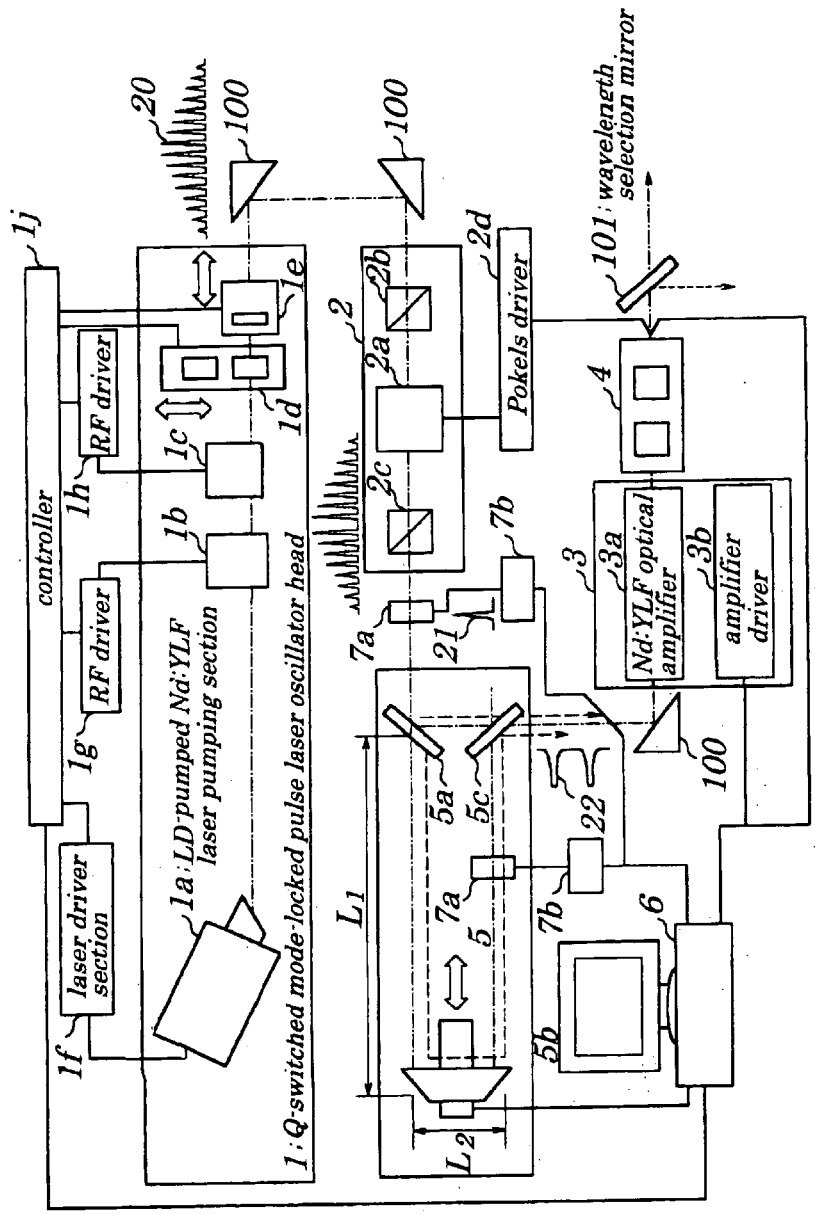
FIG. 1 is a schematic block diagram showing configurations of a laser-based repair apparatus according to a first embodiment of the present invention.

Best modes of carrying out the present invention will be described in further detail using various embodiments with reference to the accompanying drawings.

First Embodiment

First, in zapping processing, to reduce a heat affected zone to a minimum is most important. A length of thermal diffusion $L_d$ is given by:

$$L_d = (\kappa \cdot t)^{1/2}$$

where "$\kappa$" denotes a thermal diffusion coefficient and "$t$" denotes a laser pulse width. The "$\kappa$" is a value being peculiar to metal. Therefore, to decrease the length of thermal diffusion, there is no other choice but to decrease the laser pulse width. The metal on a mask on which patterning is performed is ordinarily Cr (Chromium). Since the value "$\kappa$" of Cr is $1.96 \times 10^{-5}$ [m$^2$/s], the thermal diffusion length is 0.14 μm when the pulse width of the laser is 1 ns.

When the zapping is performed on the photomask pattern with minimum line width of not more than 0.18 μm and use of a one-fourth reduction exposure method is considered, since an actual size of the pattern on the photomask is 0.72 μm (fourfold), allowable fabrication accuracy is at most 10% of a line and space (L/S) of the patterns, that is, 0.072 μm. In otherwords, even if the minimum line width is 0.18 μm, the fabrication accuracy of 70 nm is required. Considering a possibility that the line width of 0.13 μm or 0.10 μm is achieved in the near future, it is necessary to insure the fabrication accuracy of about 50 nm. This means that a region of a heat affected zone must be reduced to not more than 38.8 nm. As a result, the pulse width of the laser required for the processing is 77 ps. That is, the laser pulse of an order of 10 ps is necessary.

In order to generate the pulse width required in this range of the heat affected zone region, mode-locked laser oscillation by using a solid-state laser is required. In a case of Nd:YAG laser, for example, the pulse width of an order of about 30 ps can be obtained based on a fluorescence spectrum width of a laser medium Nd:YAG. In a case of Nd:YLF laser having a wider fluorescence spectrum, it is possible to obtain the mode-locked pulse width of an order of 20 ps. There are two methods for generating the mode-locked pulses; one being a passive way using a saturable pigment or a like, an other being an active way by synchronizing a modulated frequency of an optical modulator and a frequency determined by a length of an optical resonator. Generally, the former method can generate a short picosecond pulse in a simple manner, however, it cannot provide such high controllability as the latter method can provide. Therefore, when pulsed laser light is used as light source in laser oscillator for industrial applications, the latter method is used in many cases. Moreover, Q-switchedmode-locked pulses are usually used when high peak power of the laser is required in such cases of processing to remove metal thin layers. The Q-switched mode-locked pulse is produced by causing large pulse energy and laser peak power to be generated by an ordinary CW (Continuous Wave)-Q-switched oscillation at a larger pulse width of an order of 100 ns using an ultrasonic Q-switching device and by providing modulation in synchronization with reciprocating time in the optical resonator by using an ultrasonic light modulating device separately placed in the resonator to cause a string of mode-locked pulses to build up. If an effective length of the optical resonator (length of the optical resonator converted into a length in a vacuum) L is 0.75 m, a longitudinal mode spacing can be obtained by solving the following equation:

$$2L/c(\text{light velocity}) = 2 \times 0.75 [\text{m}]/3 \times 10^8 [\text{m/s}] = 5 \text{ns}.$$

If the pulse width obtained by the Q-switched oscillation is 100 ns, about 20 pieces of mode-locked pulses are formed in an envelope made up of the Q-switched pulse. As described above, when the Nd:YAG laser is used, the mode-locked pulses each having a width of the order of about 20 ps can be obtained.

In the method in which the Q-switching device and the mode-locking device are simply mounted, since about 20 pieces of the laser pulses are produced continuously at time intervals of 5 ns, the peak power of the laser being one of parameters in laser processing can be changed by making pumping intensity variable, however, the pulse width, time intervals among pulses making up the pulse string, the number of pulses to be used for the laser processing or a like being also other parameters in the laser processing cannot be calibrated. If considerations are given only to the problem of the heat affected zone, it is reasonable that only production of mode-locked pulses is all that is needed to solve the problem and other parameter may be arbitrary for the laser processing. However, in actuality, if a too strong laser power is applied to the metal thin layer, it has been confirmed that the limpness of the edge on the pattern increases more. This is presumably because, in the process by slit image formation in the laser repairing processing, when the time intervals among pulses making up the pulse string are short and as average irradiated power becomes larger, high order components come near to the power being a processing threshold due to accumulation of the heat and then reach a melting point, thus causing the production of the heat affected zone. Therefore, the intensity of laser irradiated power and intervals of pulse irradiation when the laser is applied in a multiple way give important meaning to the repair processing. That is, unless transient behavior of the heat at the time of laser irradiation is controlled, targeted ultra fine repair processing cannot be implemented. In other words, if parameters of the time intervals of the laser irradiation and the pulse width of the laser can be freely and strictly controlled so that the parameters can respond to physical characteristics of objects to be processed, it is possible to reduce the heat affected zone to a minimum.

Results of simulation of transient changes in temperatures at a surface of the Cr layer and in the Cr layer when the laser is applied to the Cr layer will be described below. According to "LASER HEATING OF METAL" by A. M. PROKHOROV et al. (1990), the temperature $T(z, t)$ in metal used as a one-dimensional semi-infinite sample model ($0 \leq z < \infty$) to which the laser is applied is given by:

$$T(z, t) = (2AI_0/k_T)(\kappa t)^{1/2} \times \text{ierfc}(z/(2(\kappa t)^{1/2})) \quad (1)$$

$$T(z, t > \tau p) = (2AI_0/k_T)(\kappa t) \times [(t)^{1/2} \text{ierfc}(z/(\kappa t)^{1/2}) - (t-\tau p)^{1/2} \text{ierfc}(z(2(\kappa^{1/2}(t-\tau p)^{1/2})))] \quad (2)$$

The above equation (1) represents a rise in a temperature occurring until pulse width τp is obtained. The above equation (2) represents behavior of decrease in the temperature thereafter. The value "κ" denotes a thermal diffusion coefficient, the "$k_T$" denotes thermal conductivity, the "A" denotes a absorption rate of a metal, the "$I_0$" is irradiated laser power and the "z" is an axis in a direction of depth of the metal. The surface of the metal is expressed by a state z=0. The "ierfc" denotes an error function.

By using such simple equations, transient response of the temperature of the metal at the time of laser irradiation can be calculated. Actually, since there exists the glass substrate having low thermal conductivity under the Cr thin layer in the direction of "z", the heat cannot be diffused indefinitely and therefore the laser power must be smaller than the result from the calculation. However, these calculation models can be used in a discussion from relative point of view.

Figure 5:
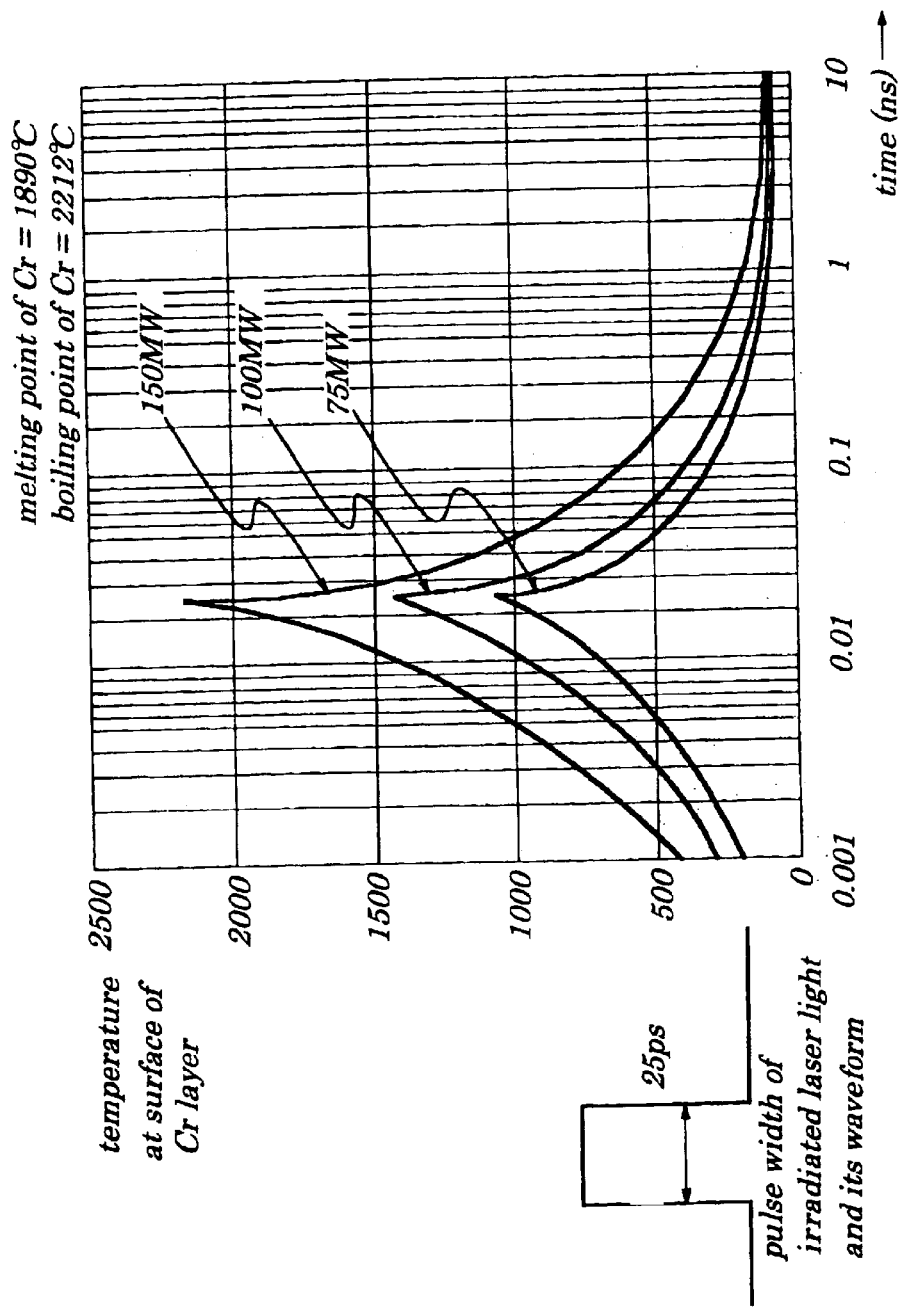
FIG. 5 is a diagram showing a result from a simulation of changes in temperatures at a surface of a Cr layer when a pulsed laser light with a pulse width of 25 ps is applied, which is employed according to the first embodiment of the present invention.

FIG. 5 is a diagram showing a result from a simulation of changes in the temperature at the surface of the Cr layer when the irradiated laser light with a pulse width of 25 ps is applied. Though laser light used here is a nearly triangular wave actually, it is handled as a complete rectangular wave in the calculation. As shown in FIG. 5, when absorbed laser power is 75 MW, temperature at the Cr layer continues to rise until irradiation of the laser is completed and finally rises to 1100° C. The above temperature becomes about 300° C. when 0.1 ns has elapsed after the start of the laser irradiation and becomes about 100° C. when 1 ns has elapsed. As a result, since the temperature does not reach a melting point of the Cr being about 1900° C., no laser processing can be carried out. When the irradiated power is 150 MW, the above temperature continues to rise up to about 2200° C. and then becomes about 600° C. when 0.1 ns has elapsed and about 200° C. when 1 ns has elapsed. Since boiling point of the Cr is about 2200° C., the Cr existing at the surface of the Cr layer, at least, evaporates.

Figure 6:
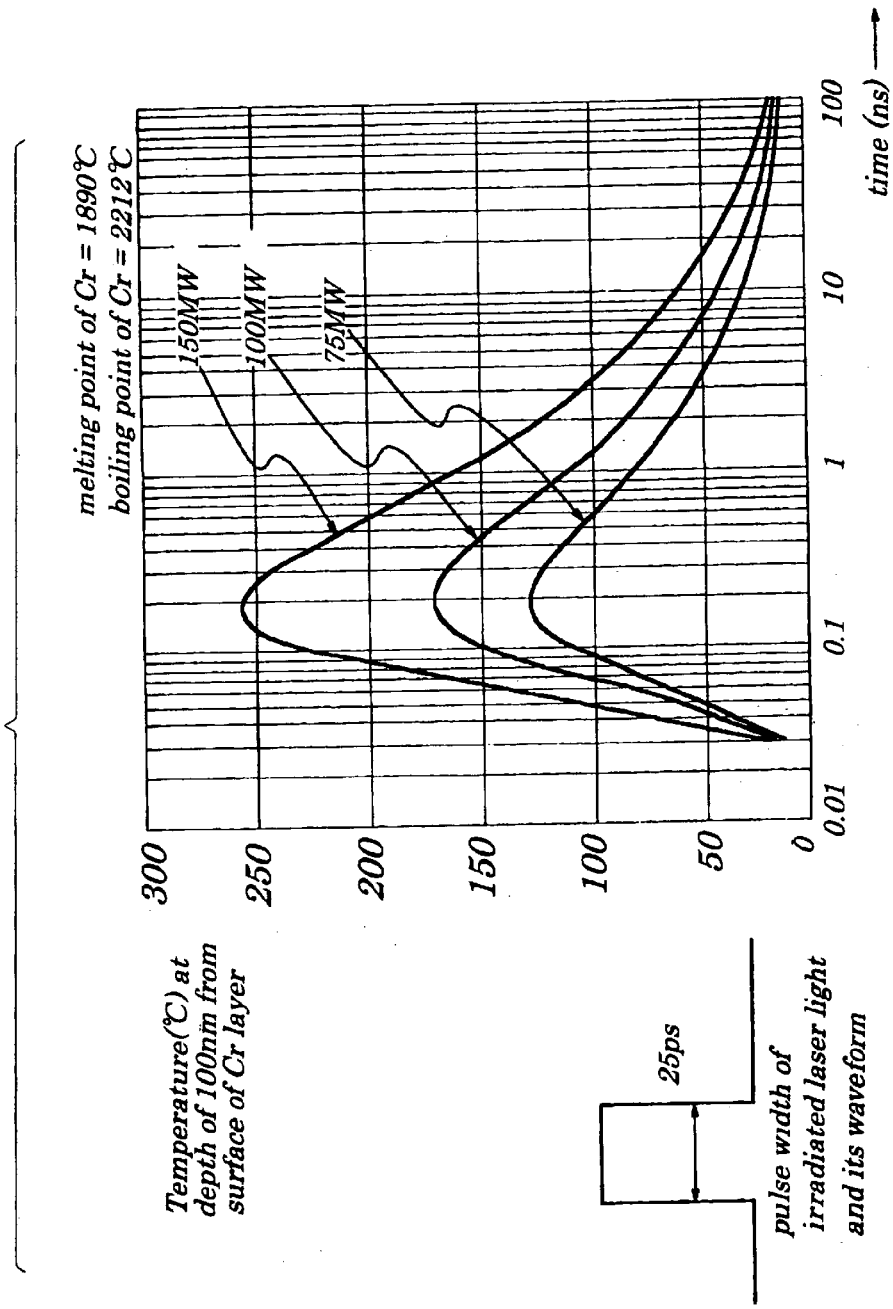
FIG. 6 is a diagram showing a result from the simulation of changes in temperatures on the inside of the Cr layer when the pulsed laser light with the pulse width of 25 ps is applied, which is employed according to the first embodiment of the present invention.

FIG. 6 is a diagram showing a calculation result of changes in temperatures at a depth of 100 nm from the surface of the Cr layer measured in accordance with the same processing parameters as are used in FIG. 5. Since the depth of 100 nm from the surface of the Cr layer is just equivalent to a thickness of the Cr layer, the calculation result enables an evaluation as to whether the temperature of the Cr layer formed on the glass substrate reaches the temperature at which the Cr layer evaporates. The result shows that internal temperature continues to rise even after irradiation of the laser is completed and reaches its maximum level when about 0.2 ns has elapsed after the start of the irradiation of the laser pulse, however, even when the irradiated laser power is its maximum 150 MW, the temperature rises only to about 255° C. However, the temperature decreasing time after being heated is long and the temperature falls to 120° C. when 2 ns has elapsed. This means that, when two mode-locked pulses are applied while the time intervals of the pulse become not more than 2 ns, the next pulse is applied before the heated part of the Cr layer is completely cooled and another heating is initiated from a place where accumulation of the heat remains.

Figure 7:
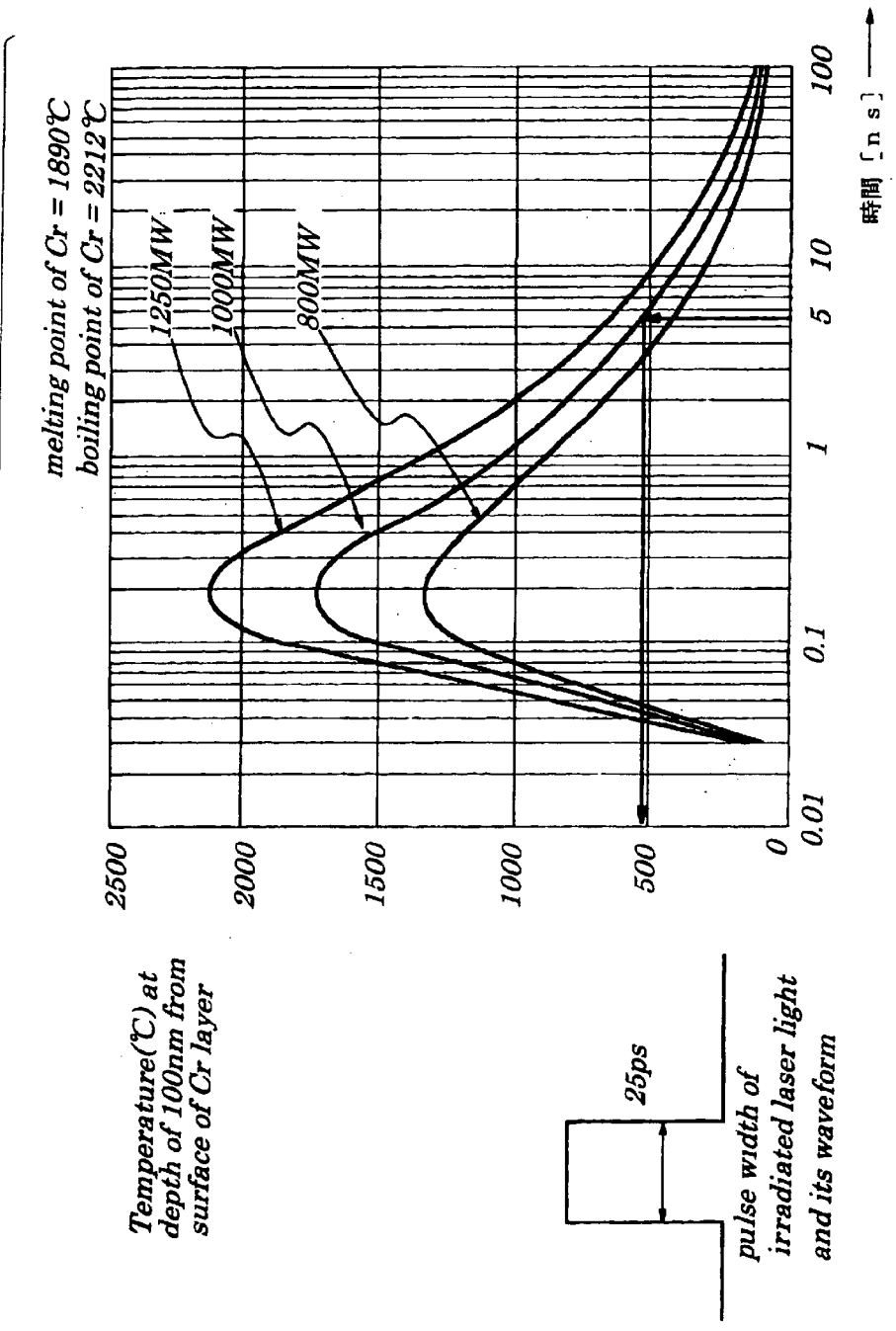
FIG. 7 is a diagram showing a result from the simulation of changes in temperatures on the inside of the Cr layer when the pulsed laser light with the pulse width of 25 ps, whose power is increased to 1250 MW, is applied, which is employed according to the first embodiment of the present invention.
Figure 8:
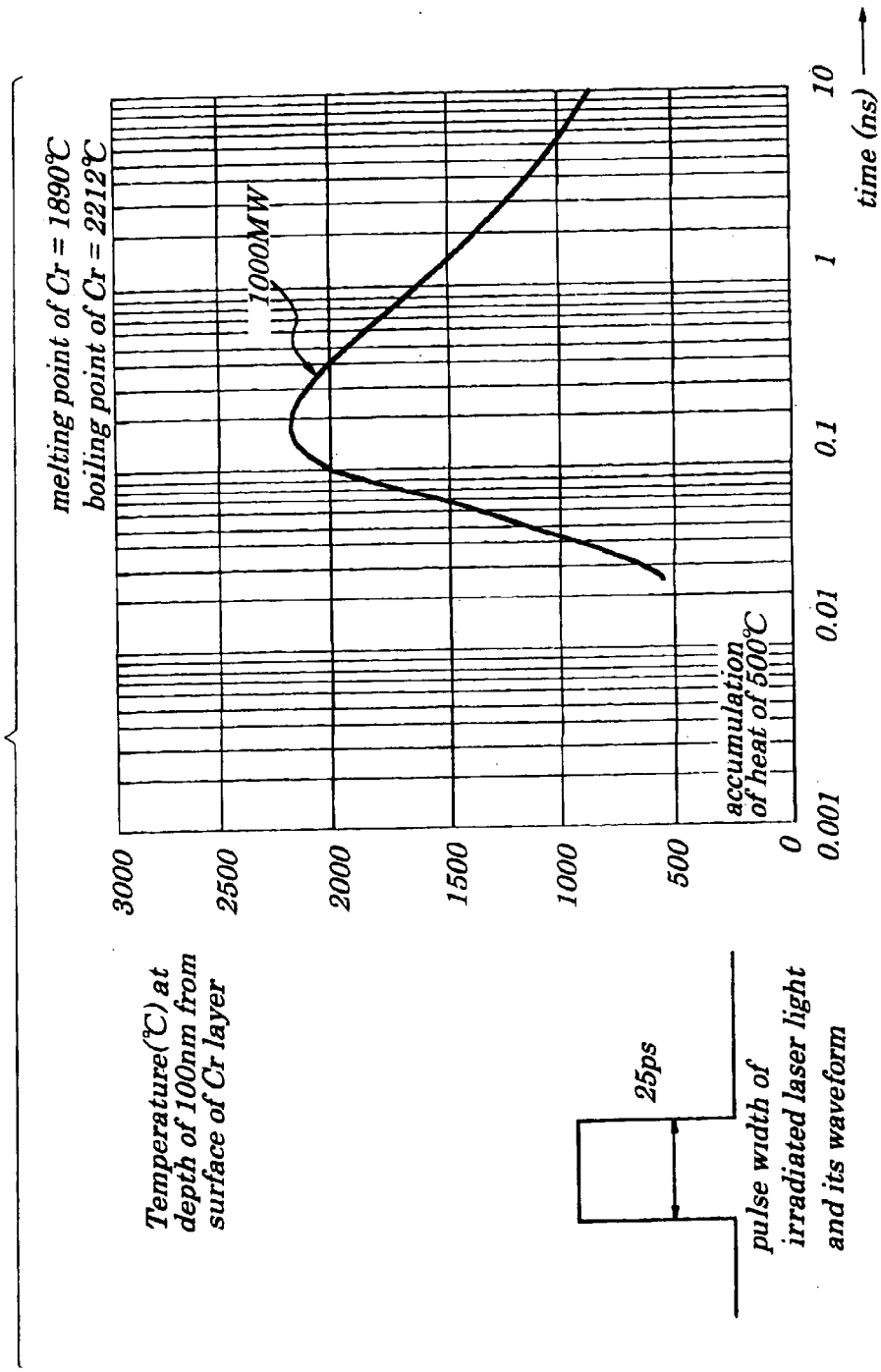
FIG. 8 is a diagram showing a result from the simulation of changes in temperatures when an irradiated laser power is increased to 1000 MW in a state in which heat of 500° C. is accumulated in the Cr layer, which is employed according to the first embodiment of the present invention.
Figures 9A, 9B:
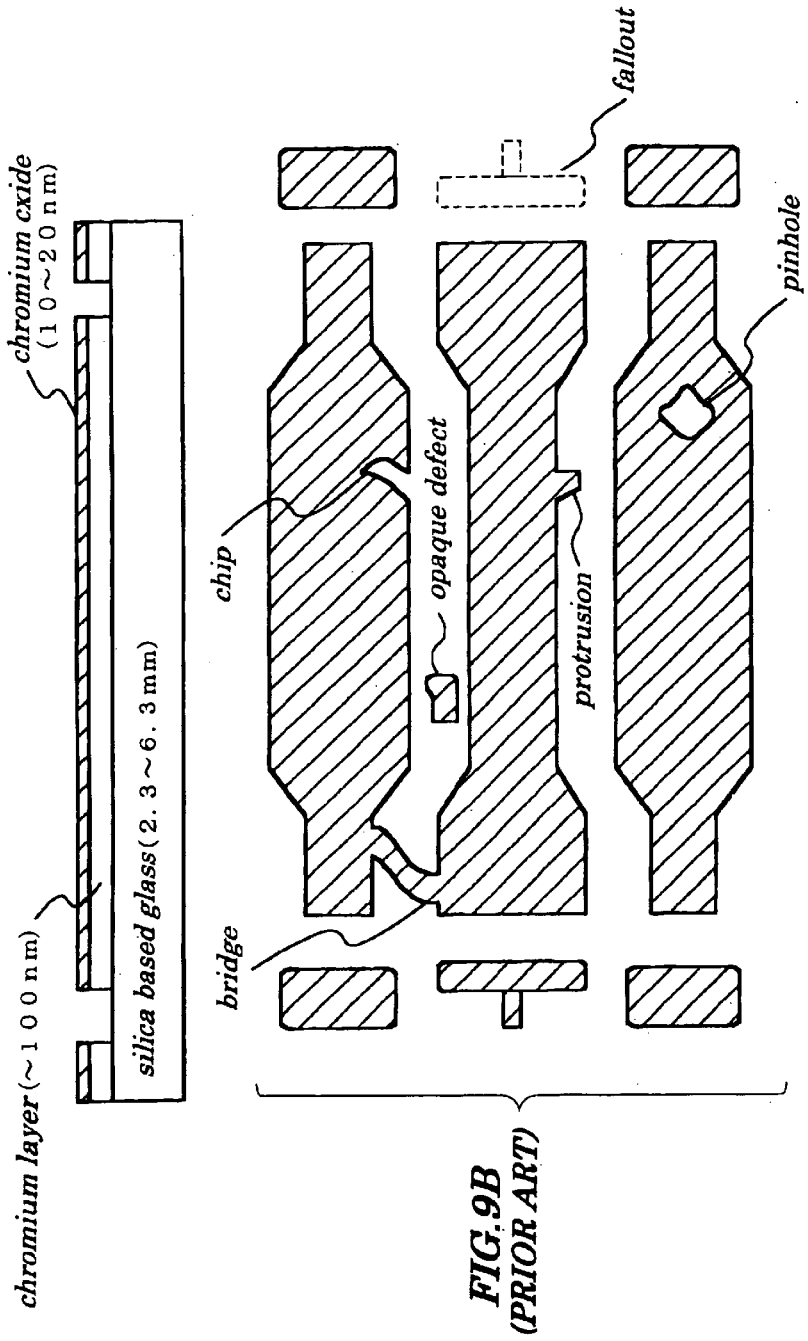
FIG. 9A is a cross-sectional view of a configuration of the photomask and FIG. 9B is a diagram showing defects on a photomask.
Figure 10:
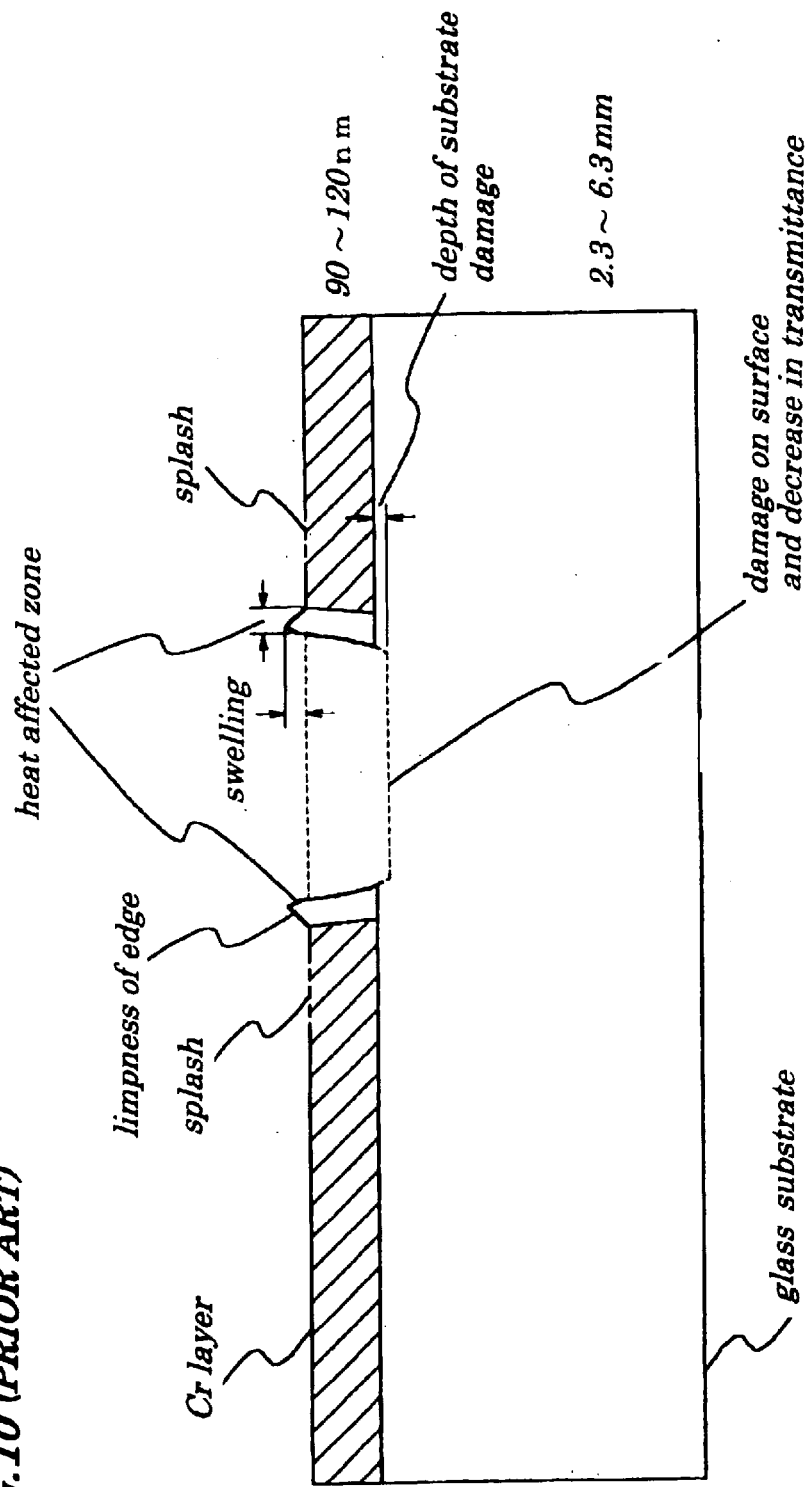
FIG. 10 is a diagram explaining a phenomenon presenting a problem in zapping processing.

Next, a state where further higher irradiated laser power is supplied is described below. FIG. 7 is a diagram showing a result from simulation of changes in temperatures on the inside of the Cr layer when the laser light pulse with a pulse width of 25 ps, whose power is increased to 1250 MW, is applied. In this case, when the temperature reaches its maximum, it exceeds the boiling point of the Cr, 2200° C. Therefore, if the laser light is applied on this condition, the Cr layer on the glass substrate is presumably evaporated completely. Now, let it be assumed that the laser power is 1000 MW. In this case, when the temperature reaches its maximum, it has not yet reached the boiling point of 1890° C. However, it comes very near to the temperature at which the Cr layer at the depth of 100 nm can be completely evaporated. If an effective length of optical resonator "d" is 0.75 m, as described above, the longitudinal mode interval is 5 ns. When two mode-locked pulses are sliced, they are applied to the Cr at intervals of 5 ns. As shown in FIG. 7, if the laser power of 1000 MW is supplied at the time point of 5 ns, it means that, while the heat of 500° C. is still left in the Cr layer, the second pulse having a pulse width of 25 ps is applied. Calculation results obtained when the absorbed laser power is 1000 MW are shown in FIG. 8. Thus, by applying the laser power of 1000 MW only, the temperature reaches 2200° C., thus enabling the Cr layer to be evaporated.

Next, configurations of the laser-based repair apparatus of the first embodiment of the present invention will be described below. FIG. 1 is a schematic block diagram showing configurations of a laser-based repair apparatus according to the first embodiment. The laser-based repair apparatus chiefly includes, when described in the order of its optical paths, a Q-switched mode-locked pulse laser oscillator head 1 used to produce Q-switched mode-locked pulses, an optical shutter 2 used to slice a desired number of pulses from a string of mode-locked pulses, an optical delaying unit 5 used to provide time delay to optical pulses, an optical amplifier 3, and a wavelength conversion element 4. The Q-switched mode-locked pulse laser oscillator head 1 has an LD (Laser Diode)-pumped Nd:YLF laser pumping section 1a which also contains an end face pumping type LD pumped YLF rod together with a complete total reflection mirror, an ultrasonic Q-switched device 1b, an ultrasonic modulator 1c used for mode-locking, an etalon plate 1d used to control the number of longitudinal modes in the optical resonator and an output mirror 1e. As peripheral devices of the Q-switched mode-locked pulse laser oscillator head 1, a laser driver section 1f, an RF (Radio Frequency) driver 1g used to drive the ultrasonic Q-switched device 1b, an RF driver 1h to drive the ultrasonic modulator 1c for mode-locking and a controller 1j used to control all components within the laser head are provided. The optical shutter 2 as a pulse slicing unit, has a Pokels device 2a using an electro-optic effect, a polarizer 2b, an optical analyzer 2c, and a Pokels driver 2d. The optical amplifier 3 (in this embodiment, the LD-pumped method is also employed to the optical amplifier 3) has a Nd:YLF optical amplifier 3a and an amplifier driver 3b serving as an LD driver for pumping. The optical delaying unit 5 used to provide time delay to optical pulses has a partial transmissive mirror 5a, a corner cube 5b with a moving mechanism made up of the total reflection prism and a synthetic mirror 5c. Other components includes total reflection mirrors 100 adapted to deflect optical paths, a wavelength selection mirror 101 adapted to select light having a fundamental wave and light having a converted wavelength, motor driven optical attenuators 7a using a λ/2 plate and drivers 7b adapted to drive the motor driven optical attenuator 7a. The whole system is controlled by a personal computer PC 6.

Next, operations of the laser-based repair apparatus of the first embodiment of the present invention will be described with reference to FIG. 1. As the laser oscillator, in order to generate the string of mode-locked pulses each having a stable laser output, the LD pumped-type Nd:YLF oscillator is used. The reason why the Nd:YLF laser is selected is that Nd:YLF laser light has a wider fluorescent spectrum width and has a longer relaxation time at a high energy level, which enables an ultra-short pulse with higher peak power to be generated. As the Q-switched device, the ordinary ultrasonic Q-switched device 1b is used. As the ultrasonic modulator 1c, devices and drivers are employed which can provide high stability so as to be fully locked with a frequency of the laser resonator. A base of the Q-switched mode-locked pulse laser oscillator head 1 is constructed of materials having low thermal expansion such as graphite in order to obtain stability in the length of the resonator. Moreover, the temperature surrounding the Q-switched mode-locked pulse laser oscillator head 1 is controlled, which is a measure to ensure stability because adjusting devices used on the base are made of metals. Thus, stable mode-locked pulses 20 are generated first and then the pulses are sliced by the optical shutter 2. Usually, only one pulse making up the highest peak in a middle position of the pulse string is sliced. One pulse 21 is extracted by performing ON/OFF control at an ns level being shorter than the longitudinal mode interval of the optical resonator on the high speed optical shutter 2 so configured that the Pokels device 2a is interposed between the polarizer 2b and the optical analyzer 2c. In order to produce a double pulse before inputting the extracted pulse, the optical delaying unit 5 used to provide time delay to optical pulses is placed. The one pulse 21 is split by the partial transmissive mirror 5a such as a half-mirror into two, causing one to be straight reflected and causing the other to be given time delay using a unit adapted to provide an optical delay and the two pulses are synthesized. In the embodiment, by using a prism mirror (or a corner cube), a delay of "$(2L_1+nL_2)/c$" can be provided to light, where $L_1$ denotes a length of an arm and $L_2$ denotes a length of the prism (with a refractive index being "n") and "c" denotes light velocity in a vacuum. For example, if the "n"=1, "$L_1$"=1 m and "$L_2$"=0.1 m, time delay of about 6.7 ns can be provided. In the optical delaying unit 5 of the embodiment, since the length of its arm $L_1$ can be calibrated continuously and by remote control, the delay time can be controlled to be about 1.0 to 6.7 ns. That is, the first pulse extracted by the optical shutter 2 (pulse slicing unit) and a second pulse delayed by the time intervals of 1.0 ns to 6.7 ns can be produced. Moreover, by using the motor driven optical attenuator 7a with the λ/2 plate adapted to change the transmissive power by adjusting polarization loss, the peak power of the above first pulse and the second pulse can be calibrated. By inputting these pulses 22 to the Nd:YLF optical amplifier 3a, properly amplified pulse can be obtained. In this embodiment, the one pulse being a small signal is amplified by using the Nd:YLF optical amplifier 3a so that its energy required for repair processing is at a mj level. Since a signal to noise ratio (S/N) of the extracted pulse is important, a polarizing element having a high extinction ratio is used. Though not shown in the figure, light having the single pulse 21 can be introduced directly into the Nd:YLF optical amplifier 3a without passing the laser light through the optical delaying unit 5. That is, the laser repair apparatus of the embodiment is so configured that the repair processing can be performed by using the single laser pulse.

Next, by controlling the optical shutter 2 so that two pulses or more can be sliced, multi-pulses can be produced at the longitudinal mode intervals (time) in the optical resonator. By changing the timing of slicing, the first pulse can have the highest peak power, or by deviating the timing of the slicing, a pulse having various shapes can be produced.

Figure 3:
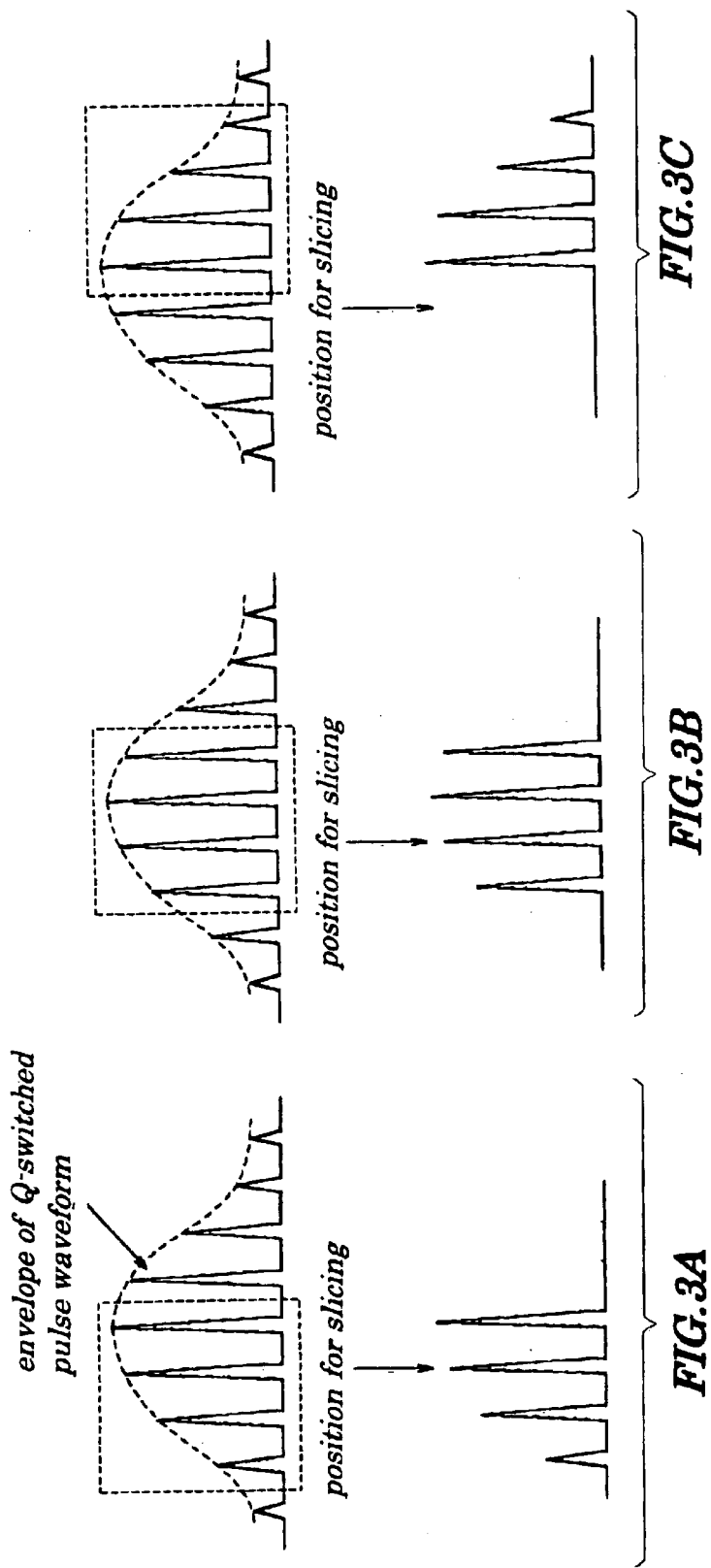
FIGS. 3A, 3B, and 3C are diagrams explaining examples of slicing laser light pulses out of a string of mode-locked pulses by using an optical shutter making up the laser-based repair apparatus according to the first embodiment of the present invention.

FIGS. 3A, 3B, and 3C are diagrams explaining examples of slicing laser light pulses out of the string of mode-locked pulses by using the optical shutter 2 making up the laser-based repair apparatus according to the first embodiment of the present invention. In the three examples, four pieces of pulses are sliced. FIG. 3A shows the slicing of four pulses whose amplitudes become larger gradually. FIG. 3B shows the slicing of four pulses in which a pulse with the highest amplitude exists in the center of the four pulses and pulses with other amplitudes exist in front and in rear. FIG. 3C shows the slicing of four pulses whose amplitudes become smaller gradually.

Figure 4:
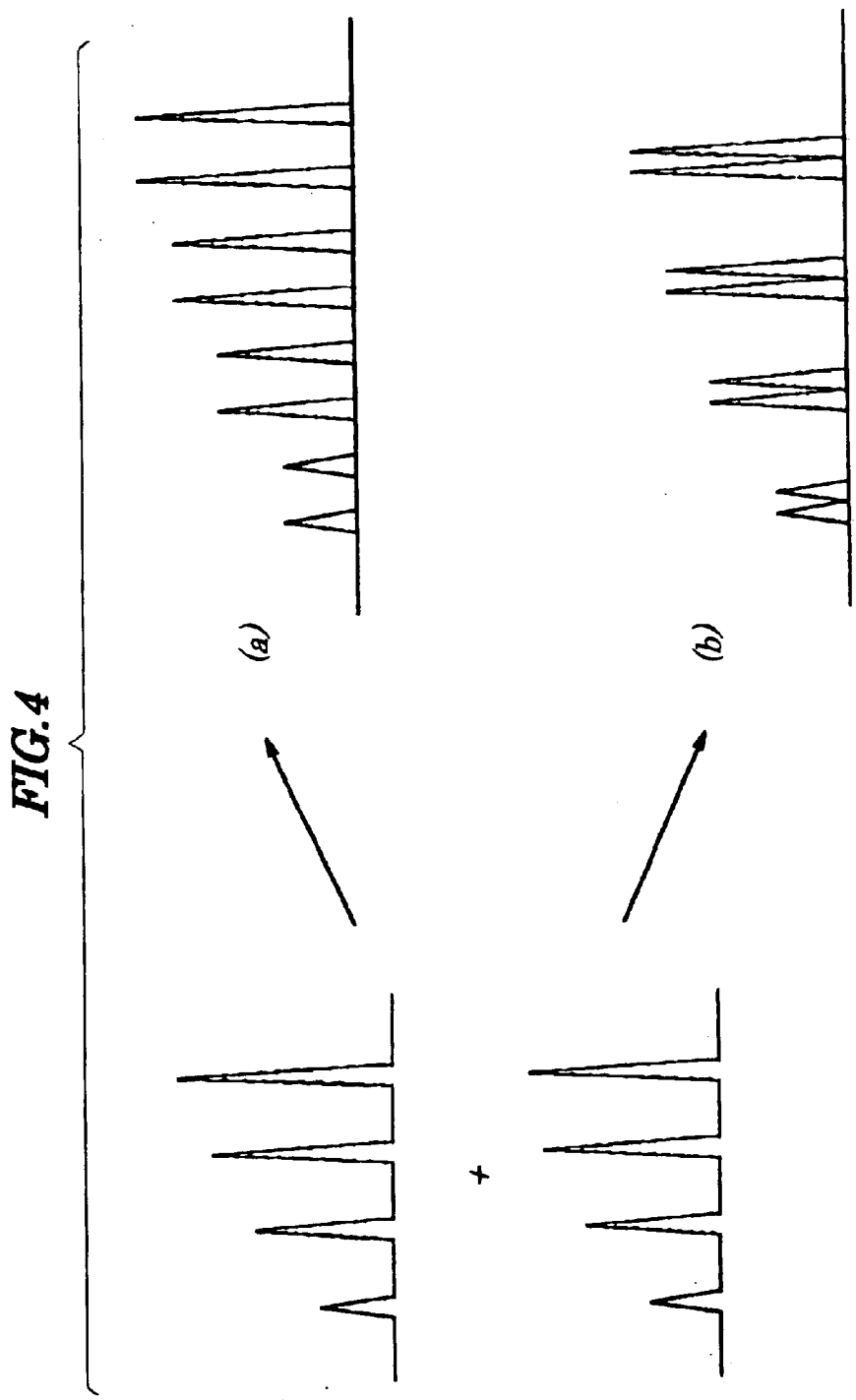
FIG. 4 is a diagram showing examples of pulses of various waveforms obtained by passing laser light having multi-pulses through an optical delaying unit according to the first embodiment of the present invention.

By passing laser light having such multi-pulses through the above optical delaying unit 5, a string of pulses having various waveforms as shown in FIG. 4 can be produced. The pulses shown in (a) of FIG. 4 are those obtained by providing an optical delay of T/2 to mode-locked pulses each having a period of "T". The pulses shown in (b) of the same figure are those obtained by deviating the multi-pulses by a width of each pulse in a manner as if the pulse width becomes doubled.

Second Embodiment

Figure 2:
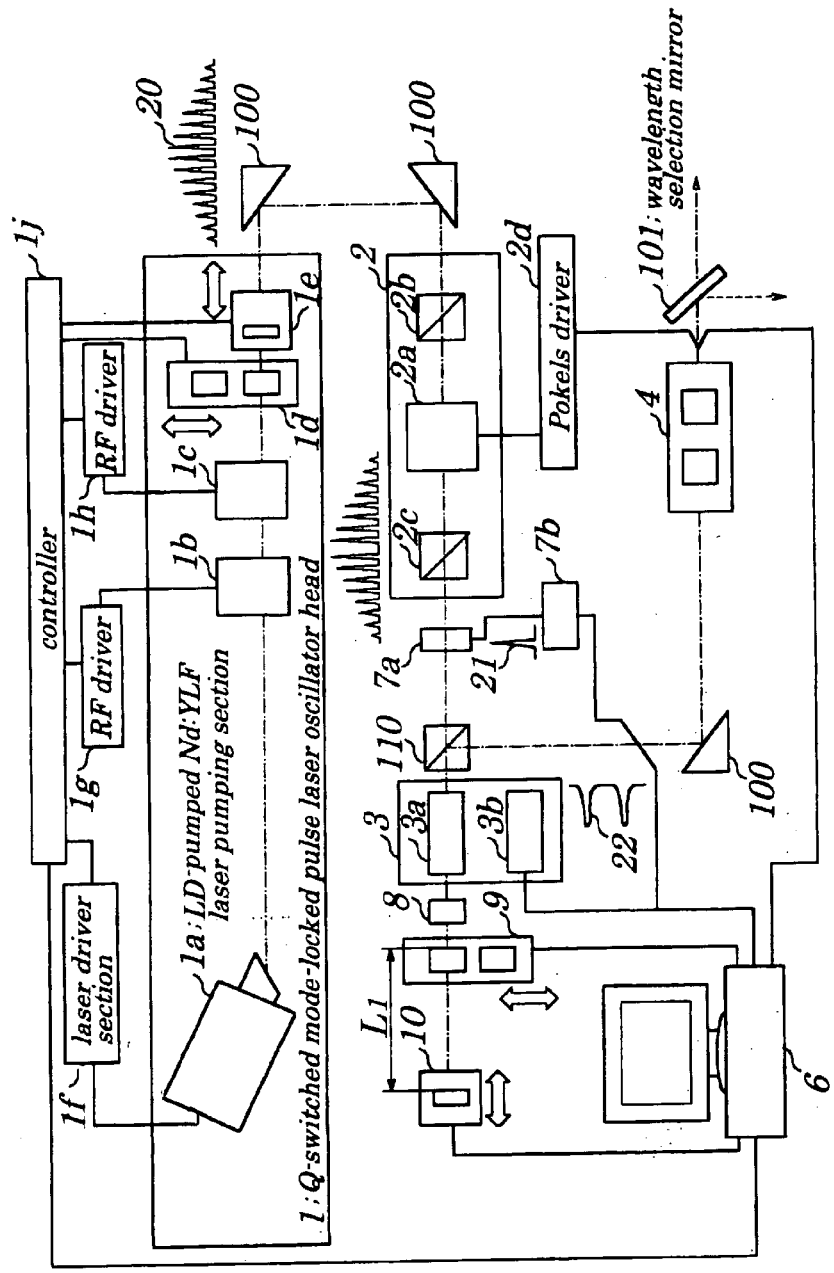
FIG. 2 is a schematic block diagram showing configurations of a laser-based repair apparatus according to a second embodiment of the present invention.

FIG. 2 is a schematic block diagram showing configurations of a laser-based repair apparatus according to a second embodiment of the present invention. Configurations of the laser repair apparatus of the second embodiment differ from those in the first embodiment in that an optical amplifier is of a double-pass type amplifier adapted to cause light to pass through the optical amplifier in a reciprocating manner. In the first embodiment, the optical amplifier is of a one-pass type amplifier. Therefore, in the second embodiment, a polarization beam splitter 110 is provided in front of an optical amplifier 3 and a ¼ wavelength plate 8; a partial transmissive mirror 9 and a total reflection mirror with a moving mechanism 10 used to delay laser light transmitted through the partial transmissive mirror 9 by a distance $2L_1$ are provided behind the optical amplifier 3. The partial transmissive mirror 9 is so configured that partial transmissive mirrors 9 each having different reflectance (transmittance) can be switched. Since the ¼ wavelength plate 8, after having allowed laser light to pass twice in to and from directions, is rotated 900 from a direction in which polarized light has entered, the laser light having passed through the optical amplifier in a reciprocating manner is totally reflected by the polarization beam splitter 110 and is taken out outside. Moreover, in the second embodiment, a mode in which the partial transmissive mirror 9 is omitted can be selected.

Next, operations of the laser repair apparatus of the second embodiment will be described by referring to FIG. 2.

Here, let it be assumed that the partial transmissive mirror 9 is a half-mirror which transmits 50% of the laser light and reflects 50% of the laser light. The laser light having a pulse 21 obtained by being sliced by an optical shutter 2 transmits through the polarization beam splitter 110 and then is amplified by the optical amplifier 3 by a single pass method in which the laser light having the sliced pulse 21 transmits through the optical amplifying medium only one time. The laser light, obtained by the single pass method, having a single pulse reflected by the partial transmissive mirror 9 at an intensity being a half of that of the incident laser light is amplified by the optical amplifier 3 by a double pass method and then is taken out by the polarization beam splitter 110. On the other hand, the laser light having passed through the partial transmissive mirror 9 and having a half of intensity of the incident light is delayed by the total reflection mirror with the moving mechanism 10 and then its power is further reduced to one second by the partial transmissive mirror 9 and is amplified by the optical amplifier by the double pass method and is taken out by the polarization beam splitter 110. That is, in the second embodiment, the incident laser light having one pulse is amplified so as to be the laser light having two pulses. In this case, delay time is $2L_1/c$. By changing reflectance (transmittance) of the partial transmissive mirror 9, it is possible to change a ratio in power between a first pulse and second pulse.

As described above, in the conventional laser-based repair apparatus, a laser pulse has a pulse width of the order of a sub-nanosecond; however, in the present invention, by using the mode-locked pulses each having a pulse width of the order of 10 picoseconds, it is made possible to perform the repair processing so finely and satisfactorily that the existence of the heat affected zone is negligible. However, it is still necessary to properly select processing parameters which can suitably meet conditions of an object to be repair-processed such as the Cr layer. When the zapping is performed by using the laser pulse with such multiple pulses, only by properly selecting the pulse intervals and the peak power of each pulse, effects obtained by using the laser light having a pulse width of the order of 10 ps can be maximized. Moreover, the maximum effects can be achieved not only by shortening the pulse width of the order of a picosecond so that parameters being peculiar to materials to be repair-processed are suitably met; but also optimizing the pulse width within an allowable range from a viewpoint of the influence by the heat, because there is a case in which a pulse width of about 100 ps is even optimum. This is very important especially when the repair processing is carried out by using the laser light with one pulse.

It is apparent that the present invention is not limited to the above embodiments but may be changed and modified without departing from the scope and spirit of the invention. For example, the laser that can be used in the present invention is not limited to the Nd:YLF laser, Nd:YAG laser, or a like; and any laser that can produce the mode-locked pulses each having the pulse width of 10 ps to 300 ps may be used. Moreover, in the application in which the increase in the laser output using the Q-switching operation is not always necessary, the laser light pulsed not by the mode-locking method may be employed. Also, the repair processing of the present invention may be applied not only to reticle photo masks for ultra LSIs but also to photo masks for large-scale LCD (LiquidCrystalDisplay) substrates. Furthermore, the repair processing of the present invention may include repair of shadow masks used for color filtering or pattern repair of various kinds of resins making up a color filter.

What is claimed is:

1. A method for repairing a pattern using a laser comprising:
    identifying a defect in the pattern;
    slicing a single laser pulse or multi-laser pulses from a string of pulses making up laser light emitted from a Q-switched mode-locked pulse laser by using an optical modulator; and
    applying said laser light having said sliced single pulse or said sliced multi-laser pulses as laser light to the defect to remove the defect for repair processing.

2. The method for repairing the pattern using the laser according to claim 1, wherein a pulse width of said laser light to be applied for said repair processing is in a range of 10 picoseconds to 300 picoseconds.

3. The method for repairing the pattern using the laser according to claim 1, wherein the number of said multi-laser pulses to be sliced from said laser light emitted from said Q-switched mode-locked pulse laser and time to start slicing said multi-laser pulses to obtain a first pulse are able to be set in an arbitrary manner.

4. A method for repairing a pattern using a laser comprising:
    identifying a defect in the pattern;
    slicing a single laser pulse or multi-laser pulses from a string of pulses making up laser light emitted from a Q-switched mode-locked pulse laser by using an optical modulator;
    directly amplifying said laser light having said sliced single laser pulse or said sliced multi-laser pulses by using an optical amplifier; and
    applying said amplified laser light as laser light to the defect to remove the defect for repair processing.

5. The method for repairing the pattern using the laser according to claim 4, wherein a pulse width of said laser light to be applied for said repair processing is in a range of 10 picoseconds to 300 picoseconds.

6. The method for repairing the pattern using the laser according to claim 4, wherein the number of said multi-laser pulses to be sliced from said laser light emitted from said Q-switched mode-locked pulse laser and time to start slicing said multi-laser pulses to obtain a first pulse arc able to be set in an arbitrary manner.

7. A method for repairing a pattern using a laser comprising:
    identifying a defect in the pattern;
    slicing a single laser pulse or multi-laser pulses from a string of pulses making up laser light emitted from a Q-switched mode-locked pulse laser using an optical modulator;
    multiplexing one laser light having a first laser pulse obtained by splitting said single laser pulse or said multi-laser pulses and an other laser light having a second laser pulse obtained by splitting said single laser pulse or said mum-laser pulses and by providing time delay to said second laser pulse into one laser light; and applying said multiplexed laser light as laser light to the defect to remove the defect for repair processing.

8. The method for repairing the pattern using the laser according to claim 7, wherein a pulse width of said laser light to be applied for said repair processing is in a range of 10 picoseconds to 300 picoseconds.

9. The method for repairing the pattern using the laser according to claim 8, wherein said time delay between said first laser pulse and said second laser pulse is in a range of 0.1 nanoseconds to 9 nanoseconds.

10. The method for repairing the pattern using the laser according to claim 7, wherein the number of said multi-laser pulses to be sliced from said laser light emitted from said Q-switched mode-locked pulse laser and time to start slicing said multi-laser pulses to obtain a first pulse are able to be set in an arbitrary manner.

11. A method for repairing a pattern using a laser comprising:
identifying a defect in the pattern;
slicing a single laser pulse or multi-laser pulses from a string of pulses making up laser light emitted from a Q-switched mode-locked pulse laser using an optical modulator;
multiplexing one laser light having a first laser pulse obtained by splitting said single laser pulse or said multi-laser pulses and an other laser light having a second laser pulse obtained by splitting said single laser pulse or said multi-laser pulses and by providing time delay to said second laser pulse into one laser light;
a step of directly amplifying said multiplexed laser light by using an optical amplifier; and
applying said amplified laser light as laser light to the defect to remove the defect for repair processing.

12. The method for repairing the pattern using the laser according to claim 11, wherein a pulse width of said laser light to be applied for said repair processing is in a range of 10 picoseconds to 300 picoseconds.

13. The method for repairing the pattern using the laser according to claim 11, wherein said time delay between said first laser pulse and said second laser pulse is in a range of 0.1 nanoseconds to 10 nanoseconds.

14. The method for repairing the pattern using the laser according to claim 11, wherein the number of said multi-laser pulses to be sliced from said laser light emitted from said Q-switched mode-locked pulse laser and time to start slicing said multi-laser pulses to obtain a first pulse are able to be set in an arbitrary manner.

15. A method for repairing a pattern using a laser comprising:
identifying a defect in the pattern;
slicing a single laser pulse or multi-laser pulses from a string of pulses making up laser light emitted from a Q-switched mode-locked pulse laser using an optical modulator;
converting a wavelength of laser light having said sliced single pulse or said sliced multi-laser pulses to produce harmonic light; and
applying said harmonic light as laser light to the defect to remove the defect for repair processing.

16. The method for repairing the pattern using the laser according to claim 15, wherein a pulse width of said laser light to be applied for said repair processing is in a range of 10 picoseconds to 300 picoseconds.

17. The method for repairing the pattern using the laser according to claim 15, wherein the number of said multi-laser pulses to be sliced from said laser light emitted from said Q-switched mode-locked pulse laser and time to start slicing said multi-laser pulses to obtain a first pulse are able to be set in an arbitrary manner.

18. A method for repairing a pattern using a laser comprising:
identifying a defect in the pattern;
slicing a single laser pulse or multi-laser pulses from a string of pulses making up laser light emitted from a Q-switched mode-locked pulse laser using an optical modulator;
multiplexing one laser light having a first laser pulse obtained by splitting said single laser pulse or said multi-laser pulses and an other laser light having a second laser pulse obtained by splitting said single laser pulse or said multi-laser pulses and by providing time delay to said second laser pulse into one laser light;
converting a wavelength of said multiplexed laser light to produce harmonic light; and
applying said harmonic light as laser light to the defect to remove the defect for repair processing.

19. The method for repairing the pattern using the laser according to claim 18, wherein a pulse width of said laser light to be applied for said repair processing is in a range of 10 picoseconds to 300 picoseconds.

20. The method for repairing the pattern using the laser according to claim 18, wherein said time delay between said first laser pulse and said second laser pulse is in a range of 0.1 nanoseconds to 10 nanoseconds.

21. The method for repairing the pattern using the laser according to claim 18, wherein the number of said multi-laser pulses to be sliced from said laser light emitted from said Q-switched mode-locked pulse laser and time to start slicing said multi-laser pulses to obtain a first pulse are able to be set in an arbitrary manner.

22. A method for repairing a pattern using a laser comprising:
identifying a defect in the pattern;
slicing a single laser pulse or multi-laser pulses from a string of pulses making up laser light emitted from a Q-switched mode-locked pulse laser using an optical modulator;
directly amplifying laser light having said sliced single laser pulse or said sliced multi-laser pulses using an optical amplifier;
converting a wavelength of said amplified laser light to produce harmonic light; and
applying said harmonic light as laser light to the defect to remove the defect for repair processing.

23. The method for repairing the pattern using the laser according to claim 22, wherein a pulse width of said laser light to be applied for said repair processing is in a range of 10 picoseconds to 300 picoseconds.

24. The method for repairing the pattern using the laser according to claim 22, wherein the number of said multi-laser pulses to be sliced from said laser light emitted from said Q-switched mode-locked pulse laser and time to start slicing said multi-laser pulses to obtain a first pulse are able to be set in an arbitrary manner.

25. A method for repairing a pattern using a laser comprising:
identifying a defect in the pattern;
slicing a single laser pulse or multi-laser pulses from a string of pulses making up laser light emitted from a Q-switched mode-locked pulse laser using an optical modulator;

multiplexing one laser light having a first laser pulse obtained by splitting said single laser pulse or said multi-laser pulses and an other laser light having a second laser pulse obtained by splitting said single laser pulse or said multi-laser pulses and by providing time delay to said second laser pulse into one laser light;

directly amplifying said multiplexed laser light by using an optical amplifier;

converting a wavelength of said amplified laser light to produce harmonic light; and applying said harmonic light as laser light to the defect to remove the defect for repair processing.

26. The method for repairing the pattern using the laser according to claim 25, wherein a pulse width of said laser light to be applied for said repair processing is in a range of 10 picoseconds to 300 picoseconds.

27. The method for repairing the pattern using the laser according to claim 25, wherein said time delay between said first laser pulse and said second laser pulse is in a range of 0.1 nanoseconds to 10 nanoseconds.

28. The method for repairing the pattern using the laser according to claim 25, wherein the number of said multi-laser pulses to be sliced from said laser light emitted from said Q-switched mode-locked pulse laser and time to start slicing said multi-laser pulses to obtain a first pulse are able to be set in an arbitrary manner.

29. A method for repairing a pattern using a laser comprising:

identifying a defect in the pattern;

slicing a single laser pulse or multi-laser pulses from a string of pulses making up laser light emitted from a Q-switched mode-locked pulse laser using an optical modulator;

directly amplifying laser light having said sliced single laser pulse or sliced multi-laser pulse by using an optical amplifier;

multiplexing one amplified laser light having a first laser pulse obtained by splitting said single laser pulse or said multi-laser pulses and an other amplified laser light having a second laser pulse obtained by splitting said single laser pulse or said multi-laser pulses and by providing time delay to said second laser pulse into one laser light;

directly amplifying said multiplexed laser light by using an optical amplifier;

converting a wavelength of said amplified laser light to produce harmonic light; and applying said harmonic light as laser light to the defect to remove the defect for repair processing.

30. The method for repairing the pattern using the laser according to claim 29, wherein a pulse width of said laser light to be applied for said repair processing is in a range of 10 picoseconds to 300 picoseconds.

31. The method for repairing the pattern using the laser according to claim 29, wherein said time delay between said first laser pulse and said second laser pulse is in a range of 0.1 nanoseconds to 10 nanoseconds.

32. The method for repairing the pattern using the laser according to claim 29, wherein the number of said multi-laser pulses to be sliced from said laser light emitted from said Q-switched mode-locked pulse laser and time to start slicing said multi-laser pulses to obtain a first pulse are able to be set in an arbitrary manner.

33. A laser-based pattern repair apparatus for repairing a defect in the pattern, the apparatus comprising:

a Q-switched mode-locked pulse laser;

an optical modulator to slice a single laser pulse or multi-laser pulses from a string of pulses contained in laser light emitted from said Q-switched mode-locked pulse laser; and wherein laser light emitted from said optical modulator is applied as laser light to the defect to remove the defect for repair processing.

34. The laser-based pattern repair apparatus according to claim 33, wherein said Q-switched mode-locked pulse laser is made up of a laser resonator having a semiconductor laser pumping unit or a lamp pumping unit, a laser medium including any one of a Nd:YLF laser, Nd:YAG laser and Nd:glass laser, an ultrasonic Q-switching element to produce Q-switched pulses, and an ultrasonic mode-locker to produce mode-locked pulses.

35. The laser-based pattern repair apparatus according to claim 33, wherein, when said multi-laser pulses are sliced by said optical modulator from laser light emitted from said Q-switched mode-locked pulse laser, the number of said multi-laser pulses to be sliced and time to start slicing a first pulse are able to be arbitrarily set and to be operated by remote control.

36. A laser-based pattern repair apparatus for repairing a defect in the pattern, the apparatus comprising:

a Q-switched mode-locked pulse laser;

an optical modulator to slice a single laser pulse or multi-laser pulses from a string of pulses contained in laser light emitted from said Q-switched mode-locked pulse laser;

an optical amplifier to directly amplify laser light having said sliced single laser pulse or said sliced multi-laser pulses emitted from said optical modulator; and wherein laser light emitted from said optical amplifier is applied as laser light to the defect to remove the defect for repair processing.

37. The laser-based pattern repair apparatus according to claim 36, wherein said Q-switched mode-locked pulse laser is made up of a laser resonator having a semiconductor laser pumping unit or a lamp pumping unit, a laser medium including any one of a Nd:YLF laser, Nd:YAG laser and Nd:glass laser, an ultrasonic Q-switching element to produce Q-switched pulses, and an ultrasonic mode-locker to produce mode-locked pulses.

38. The laser-based pattern repair apparatus according to claim 36, wherein, when said multi-laser pulses are sliced by said optical modulator from laser light emitted from said Q-switched mode-locked pulse laser, the number of said multi-laser pulses to be sliced and time to start slicing a first pulse are able to be arbitrarily set and to be operated by remote control.

39. A laser-based pattern repair apparatus for repairing a defect in the pattern, the apparatus comprising:

a Q-switched mode-locked pulse laser;

an optical modulator to slice a single laser pulse or multi-laser pulses from a string of pulses contained in laser light emitted from said Q-switched mode-locked pulse laser;

a laser pulse multiplexing and delaying unit to multiplex one amplified laser light having a first laser pulse obtained by splitting said single laser pulse or said multi-laser pulses and an other amplified laser light having a second laser pulse obtained by splitting said single laser pulse or said multi-laser pulses and by providing time delay to said second laser pulse into one laser light; and wherein laser light emitted from said laser pulse multiplexing and delaying unit is applied as laser light to the defect to remove the defect for repair processing.

40. The laser-based pattern repair apparatus according to claim 39, wherein said Q-switched mode-locked pulse laser is made up of a laser resonator having a semiconductor laser pumping unit or a lamp pumping unit, a laser medium including any one of a Nd:YLF laser, Nd:YAG laser and Nd:glass laser, an ultrasonic Q-switching element to produce Q-switched pulses, and an ultrasonic mode-locker to produce mode-locked pulses.

41. The laser-based pattern repair apparatus according to claim 39, wherein, when said multi-laser pulses are sliced by said optical modulator from laser light emitted from said Q-switched mode-locked pulse laser, the number of said multi-laser pulses to be sliced and time to start slicing a first pulse are able to be arbitrarily set and to be operated by remote control.

42. The laser-based pattern repair apparatus according to claim 39, wherein said laser pulse multiplexing and delaying unit is able to change said delay time within a range of 0.1 nanoseconds to 10 nanoseconds and said change of said delay time is able to be implemented by remote control.

43. The laser-based pattern repair apparatus according to claim 39, wherein an intensity of a peak power of said first laser pulse and said second laser pulse to be multiplexed and delayed by said laser pulse multiplexing and delaying unit is able to be controlled and calibrated by remote control.

44. A laser-based pattern repair apparatus for repairing a defect in the pattern, the apparatus comprising:
a Q-switched mode-locked pulse laser;
an optical modulator to slice a single laser pulse or multi-laser pulses from a string of pulses contained in laser light emitted from said Q-switched mode-locked pulse laser;
a laser pulse multiplexing and delaying unit to multiplex one amplified laser light having a first laser pulse obtained by splitting said single laser pulse or said multi-laser pulses and an other amplified laser light having a second laser pulse obtained by splitting said single laser pulse or said multi-laser pulses and by providing time delay to said second laser pulse into one laser light;
an optical amplifier to directly amplify said multiplexed laser light; and
wherein laser light emitted from said optical amplifier is applied as laser light to the defect to remove the defect for repair processing.

45. The laser-based pattern repair apparatus according to claim 44, wherein said Q-switched mode-locked pulse laser is made up of a laser resonator having a semiconductor laser pumping unit or a lamp pumping unit, a laser medium including any one of a Nd:YLF laser, Nd:YAG laser and Nd:glass laser, an ultrasonic Q-switching element to produce Q-switched pulses, and an ultrasonic mode-locker to produce mode-locked pulses.

46. The laser-based pattern repair apparatus according to claim 44, wherein, when said multi-laser pulses are sliced by said optical modulator from laser light emitted from said Q-switched mode-locked pulse laser, the number of said multi-laser pulses to be sliced and time to start slicing a first pulse are able to be arbitrarily set and to be operated by remote control.

47. The laser-based pattern repair apparatus according to claim 44, wherein said laser pulse multiplexing and delaying unit is able to change said delay time within a range of 0.1 nanoseconds to 10 nanoseconds and said change of said delay time is able to be implemented by remote control.

48. The laser-based pattern repair apparatus according to claim 44, wherein an intensity of a peak power of said first laser pulse and said second laser pulse to be multiplexed and delayed by said laser pulse multiplexing and delaying unit is able to be controlled and calibrated by remote control.

49. A laser-based pattern repair apparatus for repairing a defect in the pattern, the apparatus comprising:
a Q-switched mode-locked pulse laser;
an optical modulator to slice a single laser pulse or multi-laser pulses from a string of pulses contained in laser light emitted from said Q-switched mode-locked pulse laser;
a wavelength converting unit to convert a wavelength of laser light having said sliced single pulse or said sliced multi-laser pulses to produce harmonic light; and
wherein laser light emitted from said wavelength converting unit is applied as laser light to the defect to remove the defect for repair processing.

50. The laser-based pattern repair apparatus according to claim 49, wherein said Q-switched mode-locked pulse laser is made up of a laser resonator having a semiconductor laser pumping unit or a lamp pumping unit, a laser medium including any one of a Nd:YLF laser, Nd:YAG laser and Nd:glass laser, an ultrasonic Q-switching element to produce Q-switched pulses, and an ultrasonic mode-locker to produce mode-locked pulses.

51. The laser-based pattern repair apparatus according to claim 49, wherein, when said multi-laser pulses are sliced by said optical modulator from laser light emitted from said Q-switched mode-locked pulse laser, the number of said multi-laser pulses to be sliced and time to start slicing a first pulse are able to be arbitrarily set and to be operated by remote control.

52. The laser-based pattern repair apparatus according to claim 49, wherein said wavelength converting unit is a wavelength converting element using a nonlinear optical crystal to emit a third harmonic, fourth harmonic, and fifth harmonic each having a wavelength of not more than 360 nm.

53. A laser-based pattern repair apparatus for repairing a defect in the pattern, the apparatus comprising:
a Q-switched mode-locked pulse laser;
an optical modulator to slice a single laser pulse or multi-laser pulses from a string of pulses contained in laser light emitted from said Q-switched mode-locked pulse laser;
a laser pulse multiplexing and delaying unit to multiplex one laser light having a first laser pulse obtained by splitting said single laser pulse or said multi-laser pulses and an other laser light having a second laser pulse obtained by splitting said single laser pulse or said multi-laser pulses and by providing time delay to said second laser pulse into one laser light;
a wavelength converting unit to convert a wavelength of said multiplexed laser light to produce harmonic light; and
wherein laser light emitted from said wavelength converting unit is applied as laser light to the defect to remove the defect for repair processing.

54. The laser-based pattern repair apparatus according to claim 53, wherein said Q-switched mode-locked pulse laser is made up of a laser resonator having a semiconductor laser pumping unit or a lamp pumping unit, a laser medium including any one of a Nd:YLF laser, Nd:YAG laser and Nd:glass laser, an ultrasonic Q-switching element to produce Q-switched pulses, and an ultrasonic mode-locker to produce mode-locked pulses.

55. The laser-based pattern repair apparatus according to claim 53, wherein, when said multi-laser pulses are sliced by said optical modulator from laser light emitted from said Q-switched mode-locked pulse laser, the number of said multi-laser pulses to be sliced and time to start slicing a first pulse are able to be arbitrarily set and to be operated by remote control.

56. The laser-based pattern repair apparatus according to claim 53, wherein said laser pulse multiplexing and delaying unit is able to change said delay time within a range of 0.1 nanoseconds to 10 nanoseconds and said change of said delay time is able to be implemented by remote control.

57. The laser-based pattern repair apparatus according to claim 53, wherein an intensity of a peak power of said first laser pulse and said second laser pulse to be multiplexed and delayed by said laser pulse multiplexing and delaying unit is able to be controlled and calibrated by remote control.

58. The laser-based pattern repair apparatus according to claim 53, wherein said wavelength converting unit is a wavelength converting element using a nonlinear optical crystal to emit a third harmonic, fourth harmonic, and fifth harmonic each having a wavelength of not more than 360 nm.

59. A laser-based pattern repair apparatus for repairing a defect in the pattern, the apparatus comprising:

a Q-switched mode-locked pulse laser;

V an optical modulator to slice a single laser pulse or multi-laser pulses from a string of pulses contained in laser light emitted from said Q-switched mode-locked pulse laser;

an optical amplifier to directly amplify said laser light having said sliced single laser pulse or said sliced multi-laser pulses;

a wavelength converting unit to convert a wavelength of laser light emitted from said optical amplifier to produce harmonic light; and wherein laser light emitted from said wavelength converting unit is applied as laser light to the defect to remove the defect for repair processing.

60. The laser-based pattern repair apparatus according to claim 59, wherein said Q-switched mode-locked pulse laser is made up of a laser resonator having a semiconductor laser pumping unit or a lamp pumping unit, a laser medium including any one of a Nd:YLF laser, Nd:YAG laser and Nd:glass laser, an ultrasonic Q-switching element to produce Q-switched pulses, and an ultrasonic mode-locker to produce mode-locked pulses.

61. The laser-based pattern repair apparatus according to claim 59, wherein, when said multi-laser pulses are sliced by said optical modulator from laser light emitted from said Q-switched mode-locked pulse laser, the number of said multi-laser pulses to be sliced and time to start slicing a first pulse are able to be arbitrarily set and to be operated by remote control.

62. The laser-based pattern repair apparatus according to claim 59, wherein said wavelength converting unit is a wavelength converting element using a nonlinear optical crystal to emit a third harmonic, fourth harmonic, and fifth harmonic each having a wavelength of not more than 360 nm.

63. A laser-based pattern repair apparatus for repairing a defect in the pattern, the apparatus comprising:

a Q-switched mode-locked pulse laser;

an optical modulator to slice a single laser pulse or multi-laser pulses from a string of pulses contained in laser light emitted from said Q-switched mode-locked pulse laser;

a laser pulse multiplexing and delaying unit to multiplex one laser light having a first laser pulse obtained by splitting said sliced single laser pulse or said sliced multi-laser pulses and an other laser light having a second laser pulse obtained by splitting said sliced single laser pulse or said sliced multi-laser pulses and by providing time delay to said second laser pulse into one laser light;

an optical amplifier to directly amplify said multiplexed laser light;

a wavelength converting unit to convert a wavelength of laser light emitted from said optical amplifier to produce harmonic light; and wherein laser light emitted from said wavelength converting unit is used applied as laser light to the defect to remove the defect for repair processing.

64. The laser-based pattern repair apparatus according to claim 63, wherein said Q-switched mode-locked pulse laser is made up of a laser resonator having a semiconductor laser pumping unit or a lamp pumping unit, a laser medium including any one of a Nd:YLF laser, Nd:YAG laser and Nd:glass laser, an ultrasonic Q-switching element to produce Q-switched pulses, and an ultrasonic mode-locker to produce mode-locked pulses.

65. The laser-based pattern repair apparatus according to claim 63, wherein, when said multi-laser pulses are sliced by said optical modulator from laser light emitted from said Q-switched mode-locked pulse laser, the number of said multi-laser pulses to be sliced and time to start slicing a first pulse are able to be arbitrarily set and to be operated by remote control.

66. The laser-based pattern repair apparatus according to claim 63, wherein said laser pulse multiplexing and delaying unit is able to change said delay time within a range of 0.1 nanoseconds to 10 nanoseconds and said change of said delay time is able to be implemented by remote control.

67. The laser-based pattern repair apparatus according to claim 63, wherein an intensity of a peak power of said first laser pulse and said second laser pulse to be multiplexed and delayed by said laser pulse multiplexing and delaying unit is able to be controlled and calibrated by remote control.

68. The laser-based pattern repair apparatus according to claim 63, wherein said wavelength converting unit is a wavelength converting element using a nonlinear optical crystal to emit a third harmonic, fourth harmonic, and fifth harmonic each having a wavelength of not more than 360 nm.

69. A laser-based pattern repair for repairing a defect in the pattern, the apparatus comprising:

a Q-switched mode-locked pulse laser;

an optical modulator to slice a single laser pulse or multi-laser pulses from a string of pulses contained in laser light emitted from said Q-switched mode-locked pulse laser;

a laser pulse multiplexing, delaying, and amplifying unit to multiplex one laser light having a first laser pulse obtained by splitting said sliced single laser pulse or said sliced multi-laser pulses and an other amplified laser light having a second laser pulse obtained by splitting said sliced single laser pulse or said sliced multi-laser pulses and by providing time delay to said second laser pulse into one laser light and, at the same time, to directly amplify laser light having said first laser pulse by a double pass method in which said laser light is transmitted twice through an optical amplifying medium in a reciprocating manner and to directly amplify laser light having said second laser pulse by a single pass method in which said laser light is transmitted once through said optical amplifying medium;

a wavelength converting unit to convert a wavelength of laser light emitted from said laser pulse multiplexing, delaying, and amplifying unit to produce harmonic light; and wherein laser light emitted from said wavelength converting unit is applied as laser light to the defect to remove the defect for repair processing.

70. The laser-based pattern repair apparatus according to claim 69, wherein said Q-switched mode-locked pulse laser is made up of a laser resonator having a semiconductor laser pumping unit or a lamp pumping unit, a laser medium including any one of a Nd:YLF laser, Nd:YAG laser and Nd:glass laser, an ultrasonic Q-switching element to produce Q-switched pulses, and an ultrasonic mode-locker to produce mode-locked pulses.

71. The laser-based pattern repair apparatus according to claim 69, wherein, when said multi-laser pulses are sliced by said optical modulator from laser light emitted from said Q-switched mode-locked pulse laser, the number of said multi-laser pulses to be sliced and time to start slicing a first pulse are able to be arbitrarily set and to be operated by remote control.

72. The laser-based pattern repair apparatus according to claim 69, wherein said laser pulse multiplexing, delaying, and amplifying unit is able to change said delay time within a range of 0.1 nanoseconds to 10 nanoseconds and said change of said delay time is able to be implemented by remote control.

73. The laser-based pattern repair apparatus according to claim 69, wherein an intensity of a peak power of said first laser pulse and said second laser pulse to be multiplexed and delayed by said laser pulse multiplexing and delaying unit; or multiplexed, delayed, and amplified by said laser pulse multiplexing, delaying, and amplifying unit is able to be controlled and calibrated by remote control.

74. The laser-based pattern repair apparatus according to claim 69, wherein said wavelength converting unit is a wavelength converting element using a nonlinear optical crystal to emit a third harmonic, fourth harmonic, and fifth harmonic each having a wavelength of not more than 360 nm.

* * * * *